US011049935B2

(12) United States Patent
Cheng et al.

(10) Patent No.: US 11,049,935 B2
(45) Date of Patent: Jun. 29, 2021

(54) NON-PLANAR FIELD EFFECT TRANSISTOR DEVICES WITH LOW-RESISTANCE METALLIC GATE STRUCTURES

(71) Applicant: International Business Machines Corporation, Armonk, NY (US)

(72) Inventors: Kangguo Cheng, Schenectady, NY (US); Chen Zhang, Albany, NY (US); Wenyu Xu, Albany, NY (US); Xin Miao, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/662,322

(22) Filed: Oct. 24, 2019

(65) Prior Publication Data

US 2020/0075719 A1 Mar. 5, 2020

Related U.S. Application Data

(63) Continuation of application No. 16/119,220, filed on Aug. 31, 2018, now Pat. No. 10,608,083.

(51) Int. Cl.
*H01L 21/02* (2006.01)
*H01L 21/28* (2006.01)
(Continued)

(52) U.S. Cl.
CPC .... *H01L 29/0673* (2013.01); *H01L 21/02603* (2013.01); *H01L 21/28141* (2013.01);
(Continued)

(58) Field of Classification Search
CPC . H01L 29/0653; H01L 29/0673; H01L 29/16; H01L 29/413; H01L 29/66553;
(Continued)

(56) References Cited

U.S. PATENT DOCUMENTS 9,287,357 B2 3/2016 Rodder et al.
9,362,355 B1 * 6/2016 Cheng .............. H01L 29/78696
(Continued)

OTHER PUBLICATIONS

List of IBM Patents or Patent Applications Treated as Related.

*Primary Examiner* — Natalia A Gondarenko
(74) *Attorney, Agent, or Firm* — Randall Bluestone; Ryan, Mason & Lewis, LLP

(57) ABSTRACT

Methods are provided to construct field-effect transistors comprising low-resistance metallic gate structures. A field-effect transistor includes a nanosheet stack and a metal gate which covers a gate region of the nanosheet stack. The nanosheet stack includes nanosheet channel layers and an etch stop layer disposed above an upper nanosheet channel layer. The metal gate includes a work function metal which encapsulates the nanosheet channel layers, and a gate electrode disposed above and in contact with the work function metal. An upper surface of the work function metal is recessed to be substantially coplanar with the etch stop layer. The gate electrode has a resistivity which is less than a resistivity of the work function metal. The etch stop layer protects the portion of the work function metal disposed between the etch stop layer and the upper nanosheet channel layer from being etched when recessing the work function metal.

20 Claims, 20 Drawing Sheets

(51) Int. Cl.
    *H01L 21/302*     (2006.01)
    *H01L 21/8238*     (2006.01)
    *H01L 29/66*     (2006.01)
    *H01L 21/8258*     (2006.01)
    *H01L 29/78*     (2006.01)
    *H01L 29/41*     (2006.01)
    *H01L 29/06*     (2006.01)
    *H01L 21/336*     (2006.01)
    *H01L 29/51*     (2006.01)

(52) U.S. Cl.
    CPC ............ *H01L 29/413* (2013.01); *H01L 29/51* (2013.01); *H01L 29/66553* (2013.01)

(58) Field of Classification Search
    CPC ............ H01L 21/28141; H01L 21/283; H01L 21/02532; H01L 21/02603; H01L 29/51; H01L 29/78; H01L 29/78696; H01L 29/42392; H01L 29/66545; H01L 29/66439; H01L 21/00; H01L 21/02; H01L 21/02378; H01L 21/02381; H01L 21/02428; H01L 21/02444; H01L 21/0245; H01L 21/02496; H01L 21/02505; H01L 21/02507; H01L 21/02518; H01L 21/02527; H01L 21/02529; H01L 21/20; H01L 21/2033; H01L 21/2053; H01L 21/2251; H01L 21/2253; H01L 21/823468; H01L 21/823864; H01L 21/823807; H01L 21/0257; H01L 21/3065; H01L 21/3215; H01L 21/32155; H01L 21/47573; H01L 21/23857; H01L 21/82385; H01L 21/823814; H01L 21/67069; H01L 21/76837; H01L 21/76877; H01L 21/8232; H01L 21/823821; H01L 21/823842; H01L 29/66621; H01L 29/66719; H01L 29/66628; H01L 29/66575; H01L 29/78687; H01L 29/78651; H01L 29/4908; H01L 29/41733; H01L 29/6656; H01L 29/401; H01L 29/1033
    USPC .... 257/29, 192, 351, 347, 24, 369, E27.112, 257/E29.245, E21.561; 438/479, 585, 438/591, 733
    See application file for complete search history.

(56) References Cited

U.S. PATENT DOCUMENTS

| | | |
|---|---|---|
| 9,490,323 B2 | 11/2016 | Rodder et al. |
| 9,570,609 B2 | 2/2017 | Obradovic et al. |
| 9,673,279 B2 | 6/2017 | Lee et al. |
| 9,685,539 B1 | 6/2017 | Cheng et al. |
| 9,685,564 B2 | 6/2017 | Sengupta et al. |
| 9,812,329 B2 | 11/2017 | Chung et al. |
| 9,847,390 B1 | 12/2017 | Xie et al. |
| 10,608,083 B2 * | 3/2020 | Cheng .................. H01L 29/413 |
| 2008/0277691 A1 | 11/2008 | Ernst et al. |
| 2009/0194826 A1 | 8/2009 | Ernst et al. |
| 2015/0171082 A1 | 6/2015 | Choi et al. |
| 2015/0311081 A1 | 10/2015 | Xie et al. |
| 2015/0380520 A1 * | 12/2015 | Colinge ............ H01L 21/28079 257/407 |
| 2016/0071729 A1 | 3/2016 | Hatcher et al. |
| 2016/0190339 A1 | 6/2016 | Xie et al. |
| 2018/0090570 A1 | 3/2018 | Peng et al. |
| 2018/0096990 A1 | 4/2018 | Bi et al. |

* cited by examiner

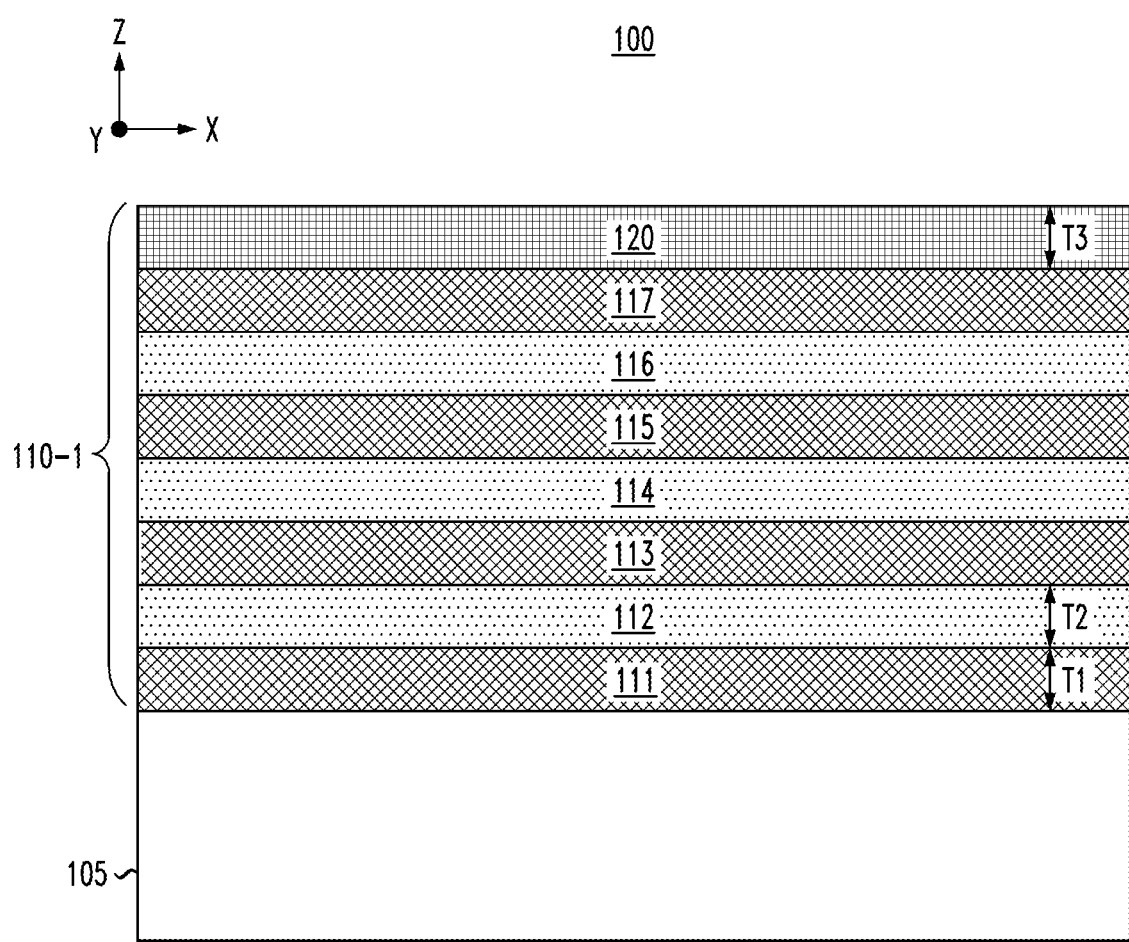

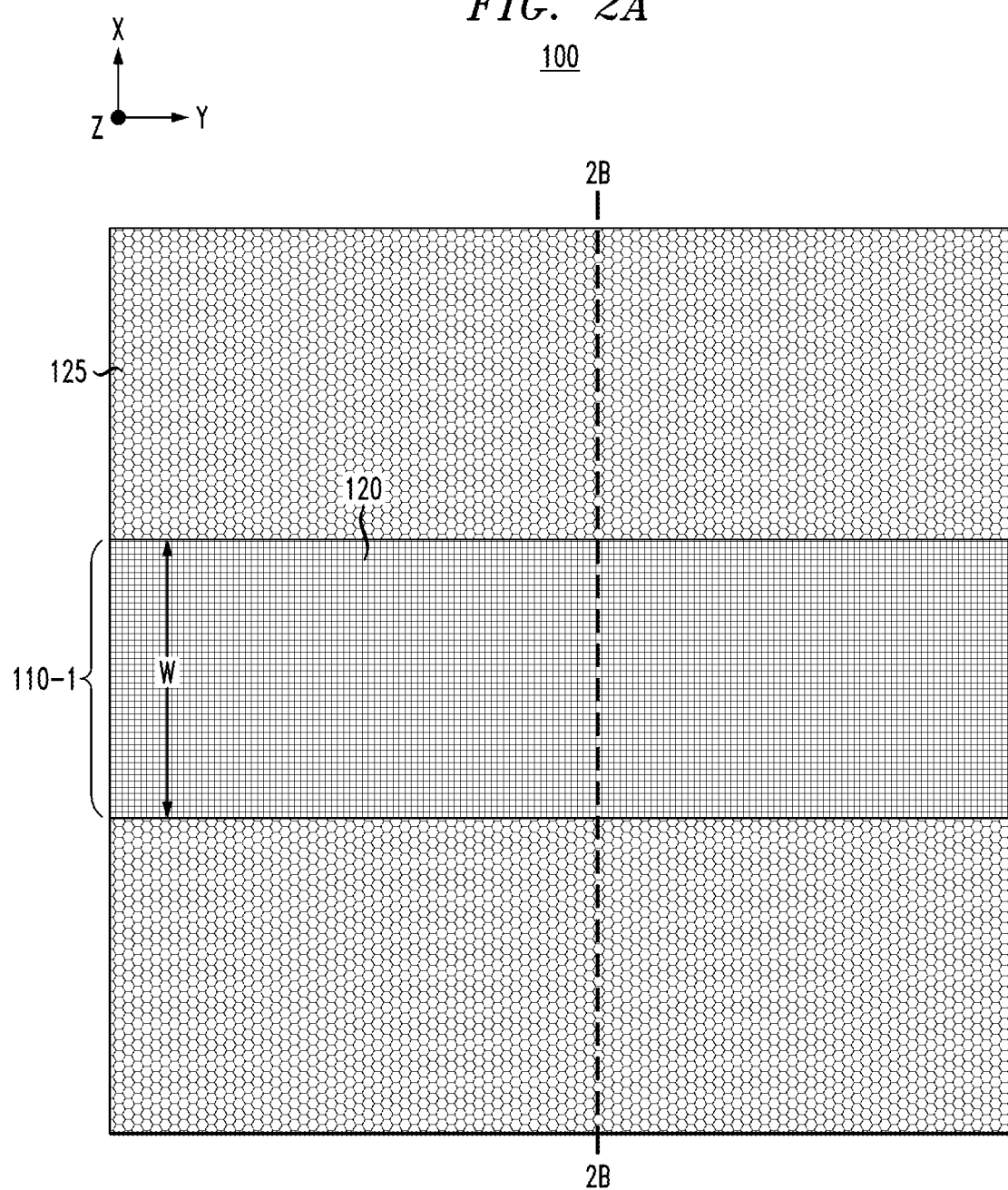

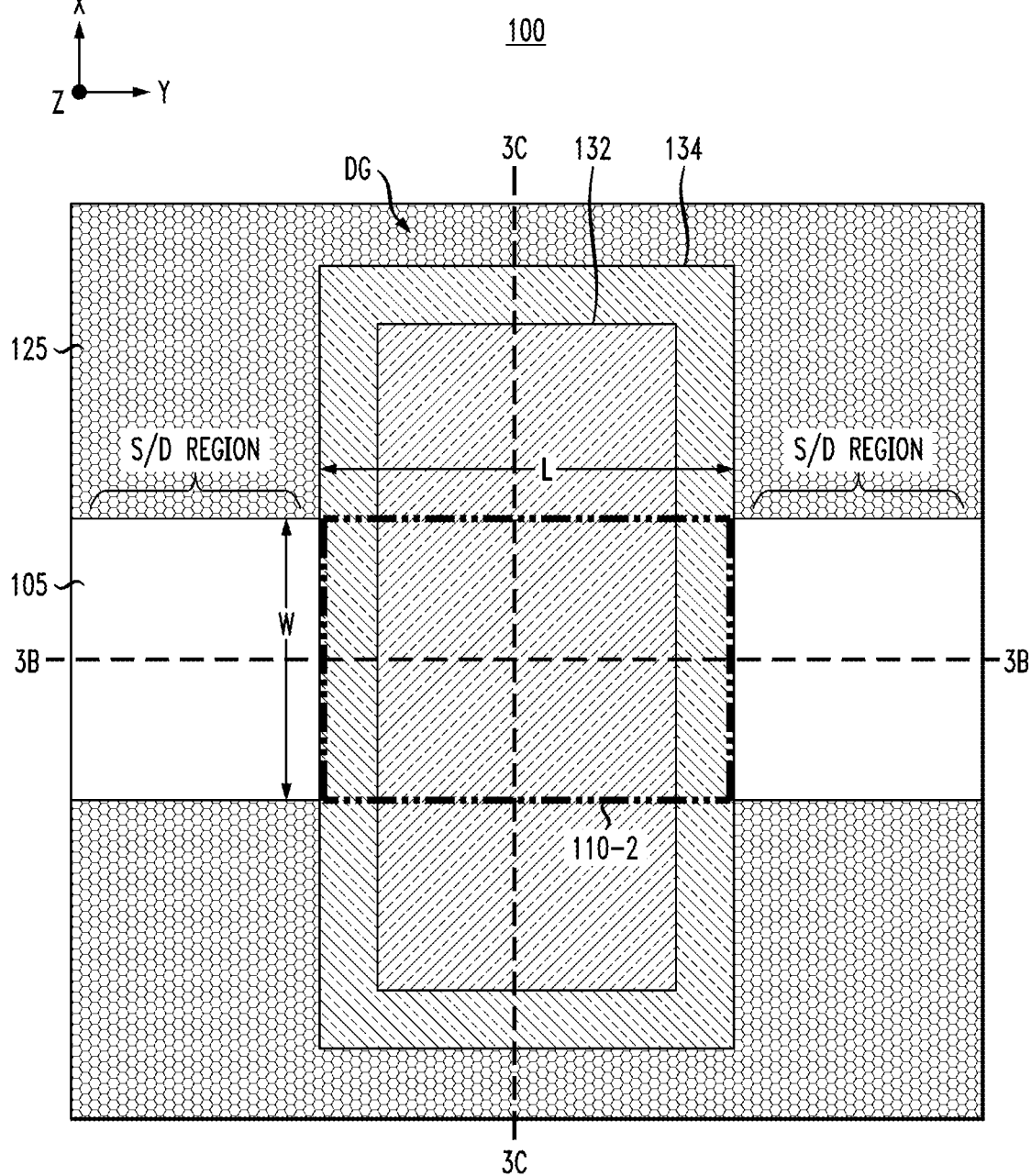

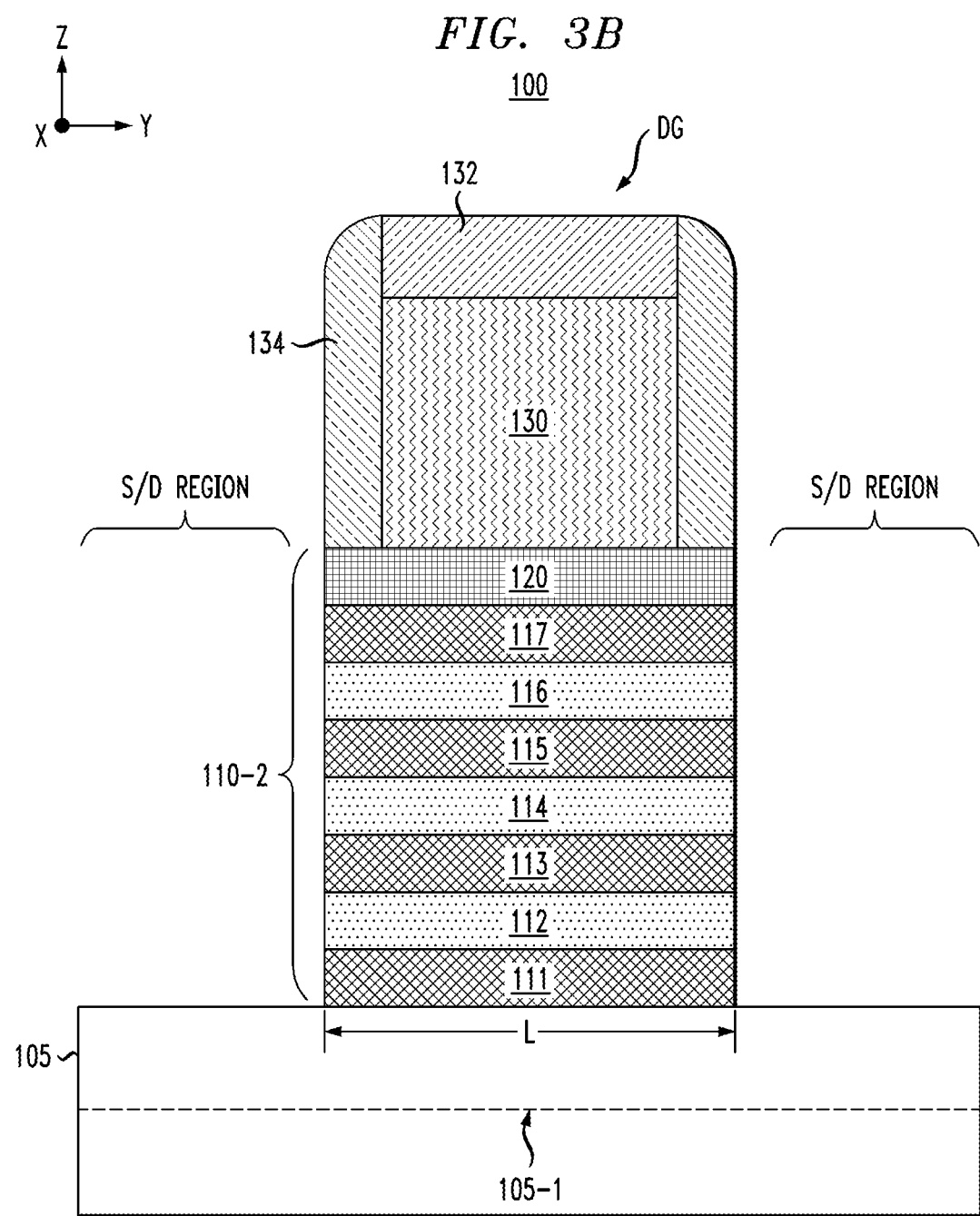

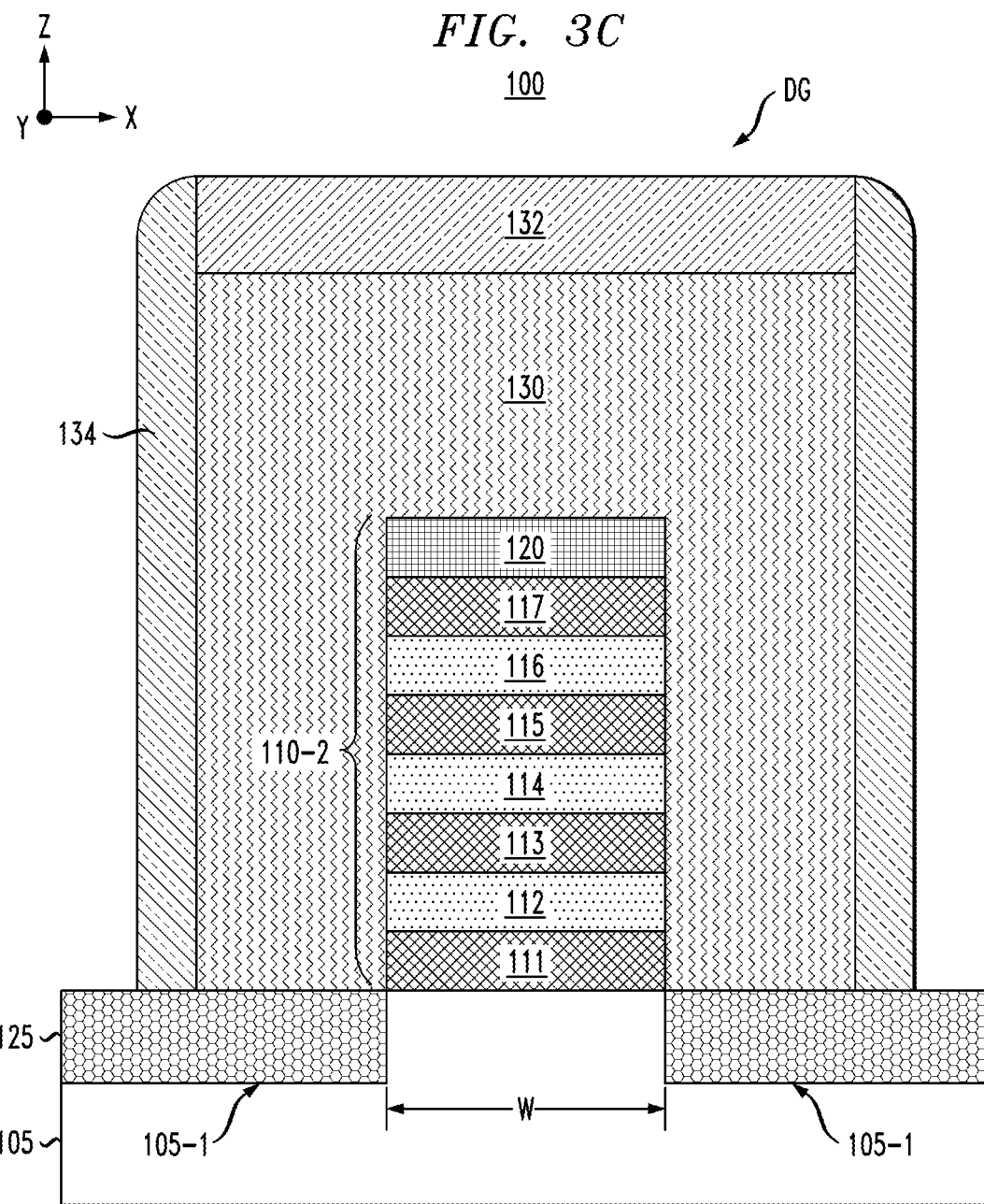

NON-PLANAR FIELD EFFECT TRANSISTOR DEVICES WITH LOW-RESISTANCE METALLIC GATE STRUCTURES

TECHNICAL FIELD

This disclosure relates generally to semiconductor fabrication techniques and, in particular, to structures and methods for fabricating non-planar field-effect transistor (FET) devices such as nanosheet FET devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, FinFET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In nanowire/nanosheet FET devices, a common gate structure is formed above and below each nanowire/nanosheet layer in the stacked configuration, thereby increasing the FET device width (or channel width), and thus the drive current, for a given footprint area.

One issue with nanosheet FET devices is gate resistance. Given the small gate length, after removing a dummy gate structure and depositing high-k gate dielectric and work function metal (WFM) in the gate opening, there is not much room left for a low resistance gate metal. This is particularly problematic with nanosheet CMOS with different WFMs. Indeed, at least some nanosheet FETs will have two WFMs in the gate opening, wherein one is for threshold voltage (Vt) control and the other is a result of multiple WFM patterning. WFM chamfering techniques can be utilized to partially remove WFM above the nanosheet stack. However, conventional WFM chamfering techniques require recessing the WFM metal directly or recessing a sacrificial material (e.g., organic planarizing layer) in the gate region, and then removing the exposed WFM. This recess is performed by timed etch, whereby the recess must be carefully controlled to ensure that enough WFM remains on an upper nanosheet layer (or active channel) at of the nanosheet stack. Otherwise, the WFM could be completely removed from the upper nanosheet layer, which adversely impacts the electrical characteristics of the upper nanosheet layer of the nanosheet stack and introduces device variability in the nanosheet FET devices.

SUMMARY

Embodiments of the invention include semiconductor devices comprising non-planar FET devices with low-resistance metallic gate structures and, and methods for fabricating non-planar FET devices comprising low-resistance metal gate structures.

For example, one embodiment includes a method for fabricating a semiconductor device. A nanosheet stack structure is formed on a semiconductor substrate, wherein the nanosheet stack structure comprises a stack of alternating semiconductor layers and an etch stop layer formed on the stack of alternating semiconductor layers, wherein the stack of alternating semiconductor layers comprises sacrificial nanosheet layers and active nanosheet channel layers, wherein each active nanosheet channel layer is disposed between sacrificial nanosheet layers in the nanosheet stack structure, and wherein the etch stop layer is formed on an upper sacrificial nanosheet layer of the nanosheet stack structure. A dummy gate is formed over the nanosheet stack structure to define a gate region. A gate sidewall spacer is formed surrounding the dummy gate. The dummy gate is removed to form an open gate region which exposes a portion of the nanosheet stack structure surrounded by the gate sidewall spacer. The sacrificial nanosheet layers exposed in the open gate region are removed to release the active nanosheet channel layers and form spaces above and below the active nanosheet channel layers. A gate dielectric material is conformally deposited within the open gate region to form a conformal layer of gate dielectric material on exposed surfaces of the etch stop layer and the active nanosheet channel layers within the open gate region. The open gate region is then filled with a work function metal, wherein the work function metal fills the spaces above and below the active nanosheet channel layers. An etch process is performed to recess the work function metal in the gate region down to the etch stop layer, wherein the etch stop layer prevents etching of the work function metal in a space between an upper active nanosheet channel layer and the etch stop layer. The gate region above the recessed work function metal is then filled with a metallic material to form a gate electrode, wherein the metallic material of the gate electrode has a resistivity which is less than a resistivity of the work function metal.

Another embodiment includes a semiconductor device which comprises a nanosheet stack structure disposed on a semiconductor substrate and a metal gate structure which covers the nanosheet stack structure. The nanosheet stack structure comprises a plurality of active nanosheet channel layers and an etch stop layer disposed above an upper active nanosheet layer of the nanosheet stack structure. The metal gate structure comprises: a conformal layer of gate dielectric material disposed on surfaces of the etch stop layer and the active nanosheet channel layers, a work function metal disposed in spaces above and below each of the active nanosheet channel layers, wherein a size of the spaces above and below each of the active nanosheet channel layers is substantially the same, wherein an upper surface of the work function metal is substantially coplanar with the etch stop layer; and a gate electrode disposed above and in contact with the work function metal, wherein the gate electrode comprises a metallic material having a resistivity which is less than a resistivity of the work function metal.

Other embodiments will be described in the following detailed description of embodiments, which is to be read in conjunction with the accompanying figures.

BRIEF DESCRIPTION OF THE DRAWINGS

FIGS. 1-8 schematically illustrate a method for fabricating a nanosheet FET device comprising a low-resistance metallic gate structure, according to an embodiment of the invention wherein:

FIG. 1 is a schematic cross-sectional side view of a semiconductor device at initial stage of fabrication comprising a semiconductor substrate and nanosheet stack structure formed on the semiconductor substrate, wherein the nanosheet stack structure comprises a stack of alternating sacrificial nanosheet layers and active nanosheet channel layers, and an etch stop layer formed on an upper sacrificial nanosheet layer of the nanosheet stack structure;

FIG. 2A is a schematic top plan view of the semiconductor structure of FIG. 1 after patterning the etch stop layer, the nanosheet stack, and the semiconductor substrate, to form an elongated nanosheet structure with a defined width W, and trenches for shallow trench isolation layers;

FIG. 3A is a schematic top plan view of the semiconductor structure in FIG. 2A after forming a dummy gate structure which overlaps a portion of the elongated nanosheet stack structure, and patterning exposed portions of the elongated nanosheet stack structure in source/drain regions adjacent to the dummy gate structure to form a nanosheet stack structure with a defined length L;

FIG. 3B is a schematic cross-sectional side view of the semiconductor structure of FIG. 3A along line 3B-3B shown in FIG. 3A;

FIG. 3C is a schematic cross-sectional side view of the semiconductor structure of FIG. 3A along line 3C-3C shown in FIG. 3A;

FIG. 4 is a schematic cross-sectional side view of the semiconductor structure of FIG. 3B after forming inner spacers, source/drain layers, and an interlayer dielectric layer;

FIG. 8 is a schematic cross-sectional side view of the semiconductor structure shown in FIG. 7B after forming a metallic gate electrode layer and a gate capping layer above the etch stop layer within the open gate region, to complete formation of a low-resistance metal gate structure of the nanosheet FET device.

FIGS. 9A, 9B, and 10 schematically illustrate a method for fabricating a nanosheet FET device comprising a low-resistance metallic gate structure, according to another embodiment of the invention, wherein:

FIG. 9A is a schematic cross-sectional side view of the semiconductor structure shown in FIG. 7A after removing the etch stop layer and the high-k gate dielectric material formed on the etch stop layer;

FIG. 9B is a schematic cross-sectional side view of the semiconductor structure of FIG. 9A along line 9B-9B shown in FIG. 9A; and FIG. 10 is a schematic cross-sectional side view of the semiconductor structure shown in FIG. 9B after forming a metallic gate electrode layer and a gate capping within the open gate region, to complete formation of a low-resistance metal gate structure of the nanosheet FET device.

FIGS. 11, 12, and 13 schematically illustrate a method for fabricating a nanosheet FET device comprising a low-resistance metallic gate structure, according to another embodiment of the invention, wherein:

FIG. 11 is a schematic cross-sectional side view of the semiconductor structure shown in FIG. 7A after replacing the gate sidewall spacer with a sacrificial sidewall spacer, and after forming a low-resistance metallic gate electrode layer and a gate capping layer with the open gate region, and after forming vertical source/drain contacts in the interlayer dielectric layer;

FIG. 12 is a schematic cross-sectional side view of the semiconductor structure of FIG. 11 after removing the sacrificial sidewall spacer and the gate capping layer; and FIG. 13 is a schematic cross-sectional side view of the semiconductor structure of FIG. 12 after forming a dielectric capping layer to encapsulate the low-resistance metallic gate electrode layer and form air spacers in narrow spaces between sidewalls of the metallic gate electrode layer and the vertical source/drain contacts.

DETAILED DESCRIPTION

Figure 2B:
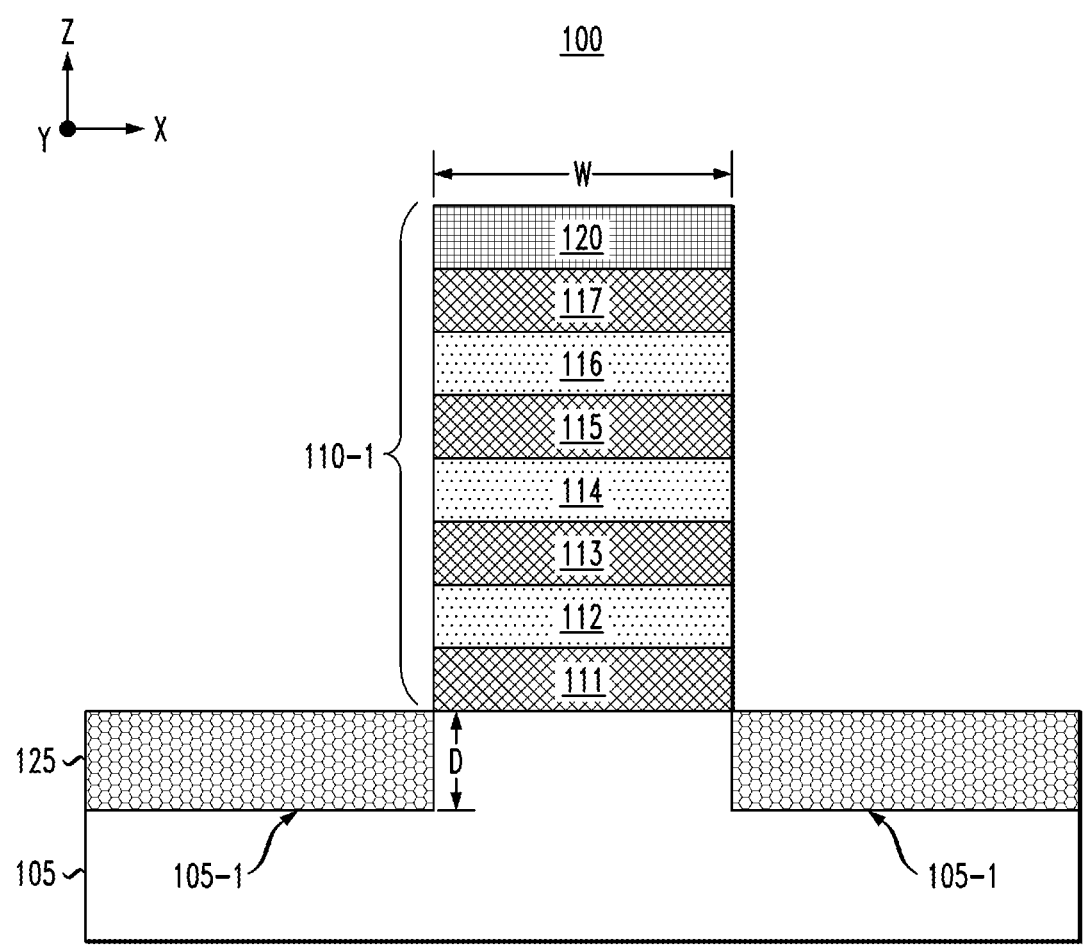
FIG. 2B a schematic cross-sectional side view of the semiconductor structure of FIG. 2A along line 2B-2B shown in FIG. 2A.

Embodiments of the invention will now be described in further detail with regard to non-planar FET devices comprising low-resistance metallic gate structures and, and methods for fabricating non-planar FET devices comprising low-resistance metal gate structures. For purposes of illustration, embodiments of the invention will be described in the context of nanosheet FET devices, although the fabrication techniques discussed herein can be readily applied to fabricate other types of non-planar FET devices such as nanowire FET devices, etc.

As explained in further detail below, methods for fabricating nanosheet FET devices are provided in which a metallic gate electrode comprising a low-resistance metallic material (e.g., cobalt, tungsten, etc.) is formed on top of a nanosheet stack comprising a plurality of active nanosheet channel layers, while ensuring that the active nanosheet channel layers are properly embedded in a high-k gate dielectric layer and a work function metal (WFM) layer. The low-resistance metallic gate electrode is formed by performing a WFM recess process to remove the WFM material above the nanosheet stack, and then filling the recessed region above the nanosheet stack with a low-resistance metallic material to form the gate electrode. The depth of the WFM recess is controlled by using an embedded etch stop layer formed on top of the nanosheet stack, which serves to protect the high-k gate dielectric and WFM of the active nanosheet channels from being etched during the WFM recess. The embedded etch stop layer ensures that each active nanosheet channel of the nanosheet stack will have the same WFM thickness above and below (and on the sides)

of the active nanosheet channels, which prevents or minimizes Vt variation. The low-resistance (or low resistivity) metallic material (e.g., cobalt) of the metallic gate electrode formed above the nanosheet stack provides for a reduced gate resistance without impacting transistor Vt. In other embodiments, methods are provided to form air spacers adjacent to the sidewalls of the metallic gate electrodes to reduce a parasitic capacitance between the metallic gate electrodes and source/drain contacts that are formed adjacent to sidewalls of gate structures of the nanosheet FET devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

FIGS. 1-8 schematically illustrate a method for fabricating a nanosheet FET device comprising a low-resistance metallic gate structure, according to an embodiment of the invention. To begin, FIG. 1 is a schematic cross-sectional side view (X-Z plane) of a semiconductor device 100 at initial stage of fabrication comprising a semiconductor substrate 105, and a nanosheet stack structure 110 formed on the semiconductor substrate 105. The nanosheet stack structure 110 comprises a stack of alternating semiconductor layers 111-117, and an etch stop layer 120 (or hard mask layer) formed on an upper semiconductor layer 117 of nanosheet stack structure 110. While the semiconductor substrate 105 is illustrated as a generic substrate layer, it is to be understood that the semiconductor substrate 105 may comprise one of different types of semiconductor substrate structures and materials.

For example, in one embodiment, the semiconductor substrate 105 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 105 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 105 (e.g., wafer) being processed.

The stack of alternating semiconductor layers 111-117 of the nanosheet stack structure 110 comprises sacrificial nanosheet layers 111, 113, 115, and 117, and active nanosheet channel layers 112, 114, and 116, wherein each active nanosheet channel layer 112, 114, and 116 is disposed between the sacrificial nanosheet layers in the nanosheet stack structure 110, and wherein the etch stop layer 120 is formed on an upper sacrificial nanosheet layer 117 of the nanosheet stack structure 110.

The stack of alternating semiconductor layers 111-117 comprises epitaxial semiconductor layers that are sequentially grown. For example, the sacrificial nanosheet layer 111 is epitaxially grown on a surface of the semiconductor substrate 105, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, the sacrificial nanosheet layer 115 is epitaxially grown on the active nanosheet channel layer 114, the active nanosheet channel layer 116 is epitaxially grown on the sacrificial nanosheet layer 115, and the sacrificial nanosheet layer 117 is epitaxially grown on the active nanosheet channel layer 116.

In one embodiment, the epitaxial semiconductor layers 111-117 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the epitaxial semiconductor layers 111-117 will depend on various factors such as the type of nanosheet FET device (p-type, or n-type), and the desired level of etch selectivity between the semiconductor layers, as well as providing sufficient lattice matching between the materials of the semiconductor layers to ensure proper (e.g., defect-free) epitaxial growth of the crystalline semiconductor layers 111-117.

For example, in one embodiment, the active nanosheet channel layers 112, 114, and 116 are formed of epitaxial silicon (Si), which is suitable to serve as semiconductor channel layers for a nanosheet FET device. When the active nanosheet channel layers 112, 114, and 116 are formed of crystalline Si, the sacrificial nanosheet layers 111, 113, 115, and 117 (which serve as sacrificial layers that are subsequently etched away to release the active nanosheet channel layers 112, 113, and 116), can be formed of an epitaxial silicon-germanium (SiGe) alloy. This allows the epitaxial SiGe material of the sacrificial nanosheet layers 111, 113, 115, and 117 to be etched selective to the epitaxial Si material of the active nanosheet channel layers 112, 114, and 116 in a subsequent process step to "release" the active nanosheet channel layers 112, 114, and 116. In other embodiments, the active nanosheet channel layers 112, 114, and 116 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116.

While the nanosheet stack of epitaxial semiconductor layers 110 is shown to include three active nanosheet channel layers 112, 114, and 116, in other embodiments of the invention, the nanosheet stack 110 can be fabricated with more or less than three active nanosheet channel layers. The etch stop layer 120 is formed with any suitable dielectric material that has etch selectivity with respect to surrounding materials during a subsequent process flow as discussed below. For example, in one embodiment, the etch stop layer 120 is formed of a silicon-carbon-oxide (SiCO) material (e.g., oxygen-doped silicon carbide film) or other similar materials.

As shown in FIG. 1, the sacrificial nanosheet layers 111, 113, 115, and 117 are formed with a thickness T1, the active nanosheet channel layers 112, 114, and 116 are formed with a thickness T2, and the etch stop layer 120 is formed with a thickness T3. The thickness T1 of the sacrificial nanosheet layers 111, 113, 115, and 117 defines the spacing size above and below the active nanosheet channel layers 112, 114, and 116, in which high-k dielectric material and work function metal is formed. The size of the spacing (e.g., T1) and the type of WFM material(s) disposed in the spaces above and below the active nanosheet channel layers 112, 114, and 116 defines, in part, the threshold voltage (Vt) of the nanosheet FET device. In one embodiment, the thickness T1 of the sacrificial nanosheet layers 111, 113, 115, and 117 is in a range of about 8 nm to about 10 nm.

The thickness T2 of the epitaxial semiconductor layers 112, 114, and 116 defines a thickness of the active nanosheet channel layers of the nanosheet FET device. The thickness T2 of the active nanosheet channel layers defines, in part, the threshold voltage (Vt) of the nanosheet FET device (e.g., Vt increases with decreasing channel thickness). In one embodiment, the thickness T2 of the active nanosheet channel layers 112, 114, and 116 is in a range of about 6 nm to about 8 nm, although the active nanosheet channel layers 112, 114, and 116 can be formed with other thickness ranges, depending on the application.

Further, the thickness T3 of the etch stop layer 120 is selected to minimize the gate height of the nanosheet FET device, while providing a sufficient thickness to serve as an etch stop layer for the given application. For example, in one embodiment, the thickness T3 of the etch stop layer 120 is in a range of about 5 nm to about 7 nm.

A next phase of the process flow comprises patterning the etch stop layer 120 and the nanosheet stack of epitaxial semiconductor layers 110 to define nanosheet structures for nanosheet FET devices in different regions of the semiconductor substrate 110. For example, FIGS. 2A and 2B are schematic views of the semiconductor structure of FIG. 1 after patterning the etch stop layer 120, the nanosheet stack 110, and the semiconductor substrate 105, to form an elongated nanosheet structure 110-1 (with a defined width W) and trenches 105-1 for shallow trench isolation (STI) layers 125. In particular, FIG. 2A is a schematic top plan view (X-Y plane) of the resulting semiconductor structure, and FIG. 2B a schematic cross-sectional side view (X-Z plane) of the resulting semiconductor structure along line 2B-2B shown in FIG. 2A. As shown in FIG. 2B, the patterning process results in forming the nanosheet stack 110-1 with an upper etch stop layer 120 and recessing the surface of the semiconductor substrate 105 to form the trenches 105-1. This initial patterning process defines a width W of the active nanosheet channel layers 112, 114, and 116 of the nanosheet FET device. In one embodiment, the width W is larger (e.g., 2× or more) than the thickness T2 of the active nanosheet channel layers 112, 114, and 116.

In one embodiment, the patterning process is performed by forming an etch mask (e.g., a photoresist mask) over the etch stop layer 120, wherein the etch mask comprises an image of the nanosheet structure 110-1 and the trenches 105-1 to be transferred into the nanosheet stack 110 and the upper surface of the semiconductor substrate 105 using a sequence of one or more dry etch processes (e.g., reactive ion etching (ME)). The etch mask can be formed using any suitable patterning process including, but not limited to, a photolithography process, or a multi-patterning process such as a sidewall image transfer (SIT) process, a self-aligned double patterning (SADP) process, a self-aligned quadruple patterning (SAQP), etc. The etching can be performed using one or more sequential dry etch processes with etch chemistries that are suitable to etch the materials of the etch stop layer 120, the semiconductor layers 111-117 of the nanosheet stack 110 and the semiconductor substrate 105.

As shown in FIG. 2B, as part of the patterning process, the upper surface of the semiconductor substrate 105 is recessed to a depth D to form the trenches 105-1 in which insulating material is deposited to form the STI layers 125. In one embodiment, the STI layers 125 are formed by a process which comprises depositing a layer of insulating material over the surface of the semiconductor structure to cover the nanosheet structure 110-1, planarizing the surface of the semiconductor structure (via chemical mechanical polishing (CMP)) down to an upper surface of the nanosheet structure 110-1 to remove the overburden insulating material, and then performing an etch-back (or recess) process to recess the remaining layer of insulating material down to a target level which defines a thickness of the STI layer 125. In one embodiment, as schematically shown in FIG. 2B, the STI layers 125 are formed with a thickness D that is substantially equal to the thickness (or depth) of the trenches 105-1 (i.e., coplanar with an upper surface of the semiconductor substrate 105). The STI layers 125 can be formed of any type of insulating material, such an oxide material, which is suitable for the given fabrication process flow. The insulating material (e.g., silicon oxide) can be deposited and patterned using known techniques.

Next, FIGS. 3A, 3B, and 3C are schematic views of the semiconductor structure shown in FIGS. 2A and 2B after forming a dummy gate (DG) structure which overlaps a portion of the elongated nanosheet structure 110-1, and then patterning exposed portions of the nanosheet structure 110-1 in source/drain regions adjacent to the dummy gate structure to form a nanosheet structure 110-2 with defined length L. In particular, FIG. 3A is a schematic top plan view (X-Y plane) of the resulting semiconductor structure, FIG. 3B a schematic cross-sectional side view (Y-Z plane) of the resulting semiconductor structure along line 3B-3B shown in FIG. 3A, and FIG. 3C is a schematic cross-sectional side view (X-Z plane) of the resulting semiconductor structure along line 3C-3C shown in FIG. 3A. As shown in FIGS. 3A, 3B, and 3C, the dummy gate structure DG comprises a dummy gate 130, a gate capping layer 132, and a gate sidewall spacer 134. The dummy gate 130 comprises sacrificial gate material such as a thin conformal oxide layer which conformally covers the surfaces of the nanosheet structure 110-2, and a sacrificial polysilicon (or amorphous silicon) gate electrode. The dummy gate DG is formed using known techniques.

For example, a thin conformal layer of silicon oxide is deposited over the entire surface of the semiconductor structure shown in FIGS. 2A and 2B, and a layer of polysilicon (or alternatively, amorphous silicon) is blanket deposited over the conformal layer of silicon oxide, and then planarized using known techniques. A hard mask layer is formed on the planarized surface of the polysilicon layer by depositing a layer of dielectric material (e.g., SiN, SiOCN, SiBCN). The hard mask layer is then patterned to form the gate capping layer 132, which defines an image of the dummy gate 130. The gate capping layer 132 is then utilized as an etch hardmask to anisotropically etch (e.g., RIE) the sacrificial polysilicon and oxide layers to thereby form the dummy gate 130.

The gate sidewall spacer 134 is then formed by depositing a conformal layer of dielectric material over the entire surface of the semiconductor structure. The conformal layer of dielectric material can be formed of SiN, SiBCN, SiCON, or any other type of dielectric material that is commonly used to form insulating gate sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the nanosheet structure 110-1 and the STI layer 125. The etch process results in the formation of the gate sidewall spacer 134, which surrounds the sidewall surfaces of the dummy gate 130 and gate capping layer 132, as shown in FIGS. 3B and 3C.

In one embodiment, the etch stop layer 120, the gate sidewall spacer 134, and the gate capping layer 132 are formed of different dielectric materials which have etch selectivity. For example, in one embodiment, the etch stop layer 120 is formed of a SiCO material, the gate capping layer 132 is formed of a silicon nitride (SiN) material, and the gate sidewall spacer 134 is formed of silicon boron carbon nitride (SiBCN).

At some point in the vertical etch process to form the gate sidewall spacer 134, the portions of the conformal layer of dielectric material on the lateral surfaces of the semiconductor structure (e.g., on the upper surface of the gate capping layer 132, the exposed upper surface of the etch stop layer 120, and the STI layers 125) will be fully etched away, but the anisotropic dry etch process continues to recess the gate capping layer 132 and pull down the vertical portions of the conformal layer of dielectric material on the sidewalls of the gate capping layer 132 and on the exposed sidewalls of the nanosheet structure 110-1. The anisotropic dry etch process is terminated when all of the dielectric material is removed from vertical sidewall surfaces of the exposed portions of the nanosheet structure 110-1. In this regard, the gate capping layer 132 (etch hardmask) is initially formed with a thickness that is greater than a vertical height of the patterned nanosheet structure 110-1 to ensure that when the dielectric material on the vertical sidewall surfaces of the nanosheet structure 110-1 is fully recessed/pulled down to the surface of the STI layers 125, a portion of the gate capping layer 132 (with reduced thickness) remains on top of the dummy gate layer 130, with the insulating gate sidewall spacer 134 fully covering the vertical sidewall surfaces of the dummy gate layer 130.

After forming the gate sidewall spacer 134, an anisotropic dry etch process (e.g., ME) is performed to etch down the exposed portions of the nanosheet stack structure 110-1 in the source/drain regions adjacent to the dummy gate (DG) structure down to the upper surface of the semiconductor substrate 105 and the STI layers 125. This etch process results in forming the nanosheet stack structure 110-2 with a defined length L in the Y-direction (see, FIGS. 3A and 3B) which defines a channel length of the active nanosheet channel layers 112, 114, and 116 of the resulting nanosheet stack structure 110-2. The width W in the X-direction (FIG. 3C) of the resulting nanosheet stack structure 110-2 is maintained since the sidewall surfaces of the nanosheet stack structure 110-2 which define the width W are covered by the dummy gate layer 130 and the gate sidewall spacer 134.

Figure 4:
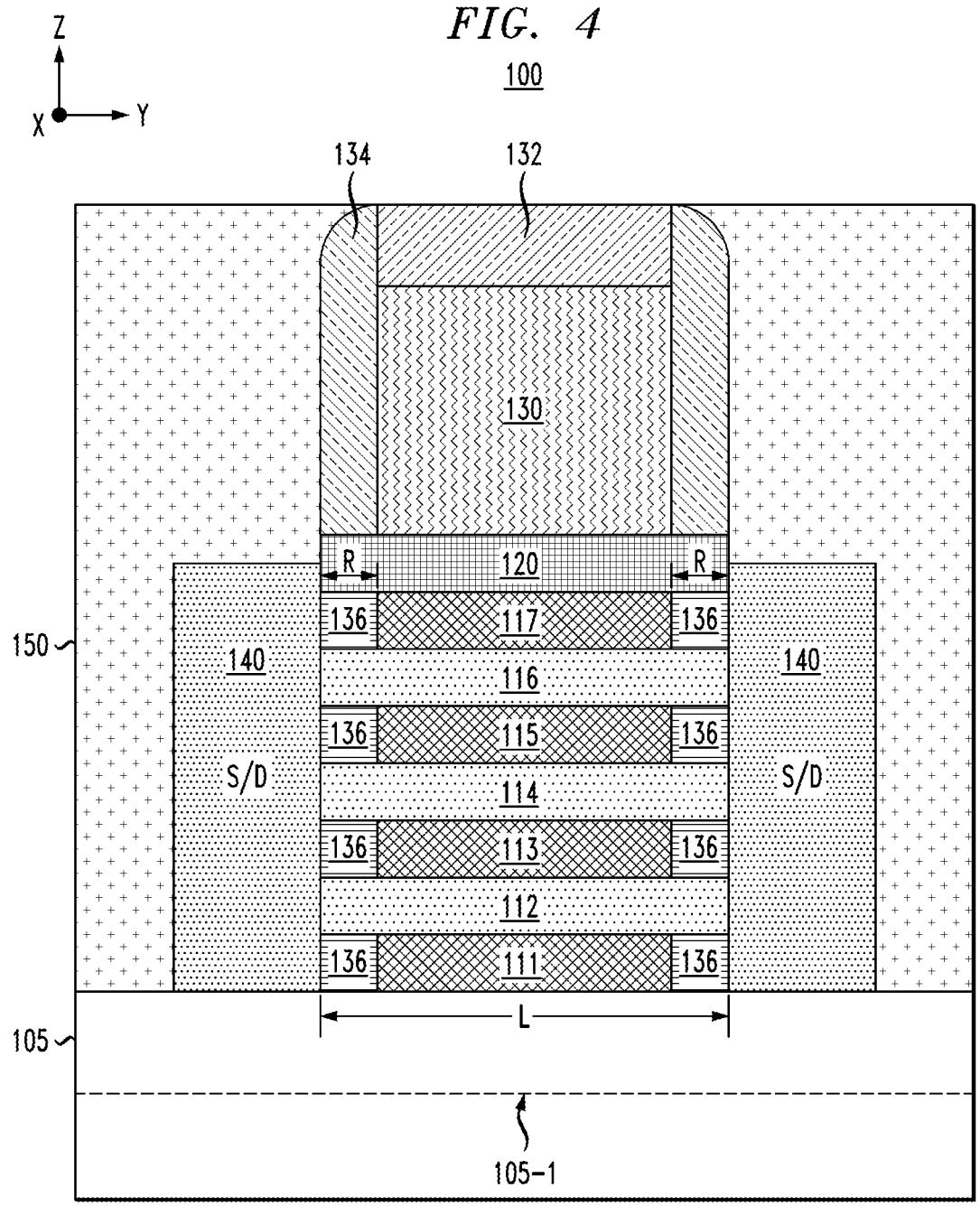

Next, FIG. 4 is a schematic cross-sectional side view of the semiconductor structure of FIG. 3B after forming inner spacers 136, source/drain (S/D) layers 140, and an interlayer dielectric (ILD) layer 150. In one embodiment, the inner spacers 136 are formed by a process which comprises laterally recessing exposed sidewall surfaces of sacrificial nanosheet layers 111, 113, 115, and 117 of the nanosheet stack structure 110-2 (shown in FIG. 3B) to form recesses in the sidewalls of the nanosheet stack structure 110-2. As shown in FIG. 4, the exposed sidewall surfaces of the sacrificial nanosheet layers 111, 113, 115, and 117 of the nanosheet stack structure 110-2 are laterally recessed to a depth R (in the Y-direction). The amount of lateral recess R is controlled through a timed etch. In one embodiment, the depth of the recess R is substantially equal to the thickness of the gate sidewall spacer 134.

In one embodiment of the invention, the lateral etch process can be performed using an isotropic wet etch process with an etch solution that is suitable to etch the semiconductor material (e.g., SiGe) of the sacrificial nanosheet layers 111, 113, 115, and 117 of the nanosheet stack structure 110-2 selective to the semiconductor material (e.g., Si) of the active nanosheet channel layers 112, 114, and 116, and the dielectric materials of the etch stop layer 120 and other exposed elements. In another embodiment, an isotropic dry plasma etch process can be performed to laterally etch the exposed sidewall surfaces of the sacrificial nanosheet layers 111, 113, 115, and 117 selective to the active nanosheet channel layers 112, 114, and 116, and the dielectric materials of the etch stop layer 120 and other exposed elements.

The recesses are then filled with dielectric material to the form inner spacers 136 (or embedded spacers) on the sidewalls of the nanosheet stack structure 110-2. In one embodiment, the inner spacers 136 are formed by depositing a conformal layer of dielectric material over the semiconductor structure until the recesses are filled with dielectric material, followed by an etch back to remove the excess dielectric material. In one embodiment, the inner spacers 136 are formed of the same dielectric material used to form the gate sidewall spacers 134. For example, the embedded gate insulating spacers 136 can be formed of SiN, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structure 110-2 and expose the sidewalls of the active nanosheet channel layers 112, 114, and 116, while leaving the dielectric material in the recesses to form the inner spacers 136. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Following formation of the inner spacers 136, the source/drain layers 140 are formed by epitaxially growing semiconductor material (e.g., epitaxial Si material or SiGe material) on the exposed sidewall surfaces of the active nanosheet cannel layer 112, 114, and 116 using known techniques such as CVD, MOCVD, LPCVD, MBE, VPE, or other known epitaxial growth techniques which are suitable for the given process flow. The type of epitaxial semiconductor material that is used to form the source/drain layers 140 will vary depending on various factors including, but not limited to, the type of material of the active nanosheet channel layers 112, 114, and 116, the device type (e.g., n-type or p-type) of the nanosheet FET device, etc.

The epitaxial growth of the semiconductor material on the exposed sidewall surfaces of the active nanosheet channel layers 112, 114, and 116 is performed so that the epitaxial material merges to form the source/drain layers 140 on the vertical sidewalls of the nanosheet stack structure 110-2 which define the channel length L (in the Y direction) of active nanosheet channel layers 112, 114, and 116. Furthermore, in one embodiment, the source/drain regions 140 are doped using known techniques. For example, in one embodiment, the source/drain layers 140 are "in-situ" doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the epitaxially grown semiconductor material. Although not specifically shown in FIG. 4, prior to forming the source/drain layers 140, an isolation layer can be formed on or within a recess of the exposed surface of the substrate 105 to provide isolation between the source/drain layers 140 and the substrate 105.

In addition, in one embodiment of the invention, a thermal anneal process is performed following the epitaxial growth of the doping of source/drain layers 140 to cause dopants to be injected into the end portions of the active nanosheet channel layers 112, 114, and 116 that are in contact with the epitaxial semiconductor material of the source/drain layers 140. This process effectively results in extending the source/drain regions 140 into the semiconductor material of the end portions of the active nanosheet channel layers 112, 114, and 116.

Following the formation of the epitaxial source/drain layers 140, the process flow continues with forming the interlevel (ILD) layer 150 (or pre-metal dielectric (PMD) layer) to encapsulate the dummy gate structure and source/drain layers 150 in dielectric/insulating material, prior to commencing a replacement metal gate process. In one embodiment, the ILD layer 150 is formed by depositing a blanket layer of dielectric/insulating material over the semiconductor structure and planarizing the layer of dielectric/insulating material down to the gate capping layer 132 to form the ILD layer 150, as shown schematically shown in FIG. 4. The ILD layer 150 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the ILD layer 150 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layer 132. In some embodiments, the ILD layer 150 comprises a silicon nitride liner on the surfaces of dummy gate, spacers, and source/drain, and silicon oxide filling the remaining space.

Figure 5A:
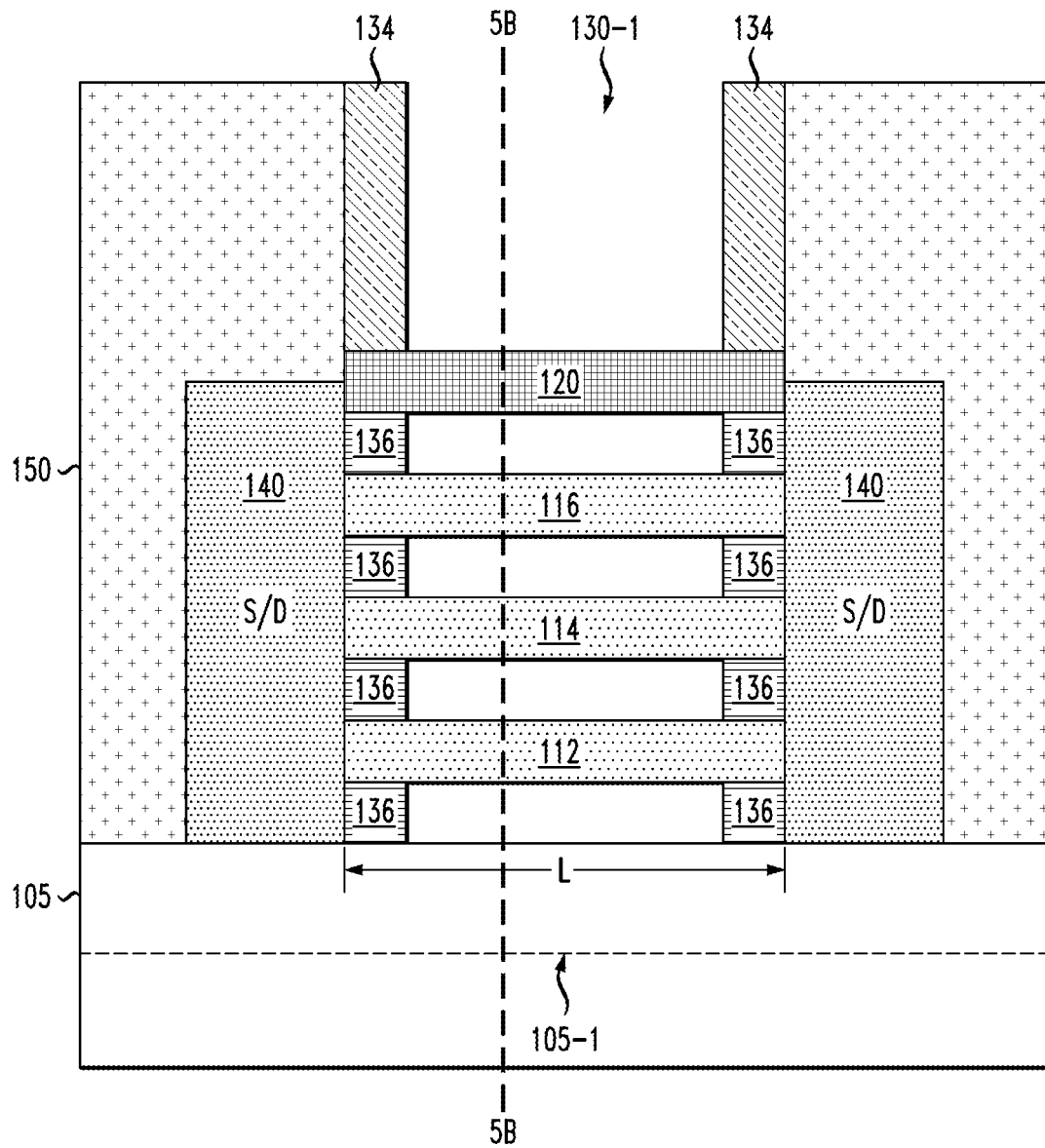
FIG. 5A is a schematic cross-sectional side view of the semiconductor structure shown in FIG. 4 after removing a dummy gate capping layer, a dummy gate layer, and removing sacrificial nanosheet layers of the nanosheet stack structure to release active nanosheet channel layers of the nanosheet stack structure and form an open gate region.

Following the formation of the ILD layer 150, a replacement metal gate process is performed to replace the dummy gate layer 130 with a metal gate structure, using a process flow as schematically illustrated in FIG. 5A through FIG. 8. For example, FIGS. 5A and 5B are schematic views of the semiconductor structure shown in FIG. 4 after removing the dummy gate capping layer 132, the dummy gate layer 130, and removing the sacrificial nanosheet layers 111, 113, 115, and 117 to release the active nanosheet channel layers 112, 114 and 118 and form an open gate region 130-1. FIG. 5A is a schematic cross-sectional side view (Y-Z plane) of the resulting semiconductor structure, and FIG. 5B is a schematic cross-sectional side view (X-Z plane) of the resulting semiconductor structure along line 5B-5B shown in FIG. 5A.

In one embodiment, the dummy gate capping layer 132 can be removed by planarizing (e.g., via CMP) the surface of the semiconductor structure of FIG. 4 down to the upper surface of the dummy gate layer 130. In another embodiment, the dielectric material of the dummy gate capping layer 132 (e.g., SiN) can be etched away selective to the materials gate sidewall spacer 134 (e.g., silicon boron carbon nitride (SiBCN)) and the ILD layer 150 (e.g., silicon oxide) to expose the underlying dummy gate layer 130. The dummy gate layer 130 (e.g., sacrificial gate polysilicon layer, and dummy gate oxide layer) is then etched away using known etching techniques and etch chemistries. For example, the sacrificial dummy gate polysilicon material can be removed using a selective dry etch or wet etch process with suitable etch chemistries, including ammonium hydroxide ($NH_4OH$), tetramethylammonium hydroxide (TMAH), or $SF_6$ plasma. The etching of the dummy poly gate layer is selective to, e.g., dummy gate oxide layer, to thereby protect the active nanosheet channel layers 112, 114, and 116 from being etched during the poly etch process. After the polysilicon material is removed, an oxide etch process is performed to etch away the dummy gate oxide layer selective to, e.g., the active nanosheet channel layers 112, 114, and 116 and the etch stop layer 120. In this manner, the sacrificial materials (e.g., dummy polysilicon and oxide layers) of the dummy gate layer 130 can be etched away without damaging the active nanosheet channel layers 112, 114, and 116, or removing the etch stop layer 120.

After removing the dummy gate layer 130, an etch process is performed to selectively etch away the sacrificial nanosheet layers 111, 113, 115, and 117 of the nanosheet stack structure 110-2 to release the active nanosheet channel layers 112, 114, and 116, thereby allowing the open gate region 130-1 to extend into spaces between and adjacent to the active nanosheet channel layers 112, 114, and 116. The sacrificial nanosheet layers 111, 113, 115, and 117 (e.g., SiGe layers) can be etched away selective to the active nanosheet channel layers 112, 114, and 116 (Si layers) and the etch stop layer 120 (e.g., SiCO) using a wet etch process, for example. In one embodiment, the SiGe material of the sacrificial nanosheet layers 111, 113, 115, and 117 can be selectively etched (with high etch selectivity) using a gas phase HCl (hydrochloric acid) or wet etch solution to laterally etch the SiGe material of the sacrificial nanosheet layers 111, 113, 115, and 117 selective to the Si material of the active nanosheet channel layers 112, 114, and 116 and the SiCO material of the etch stop layer 120. The gas phase HCl (hydrochloric acid) provides high etch selectivity when, for example, the active nanosheet channel layers 112, 114, and 116 are formed of Si or SiGe with a lower Ge concentration than the SiGe material of the sacrificial nanosheet layers 111, 113, 115, and 117.

Figure 5B:
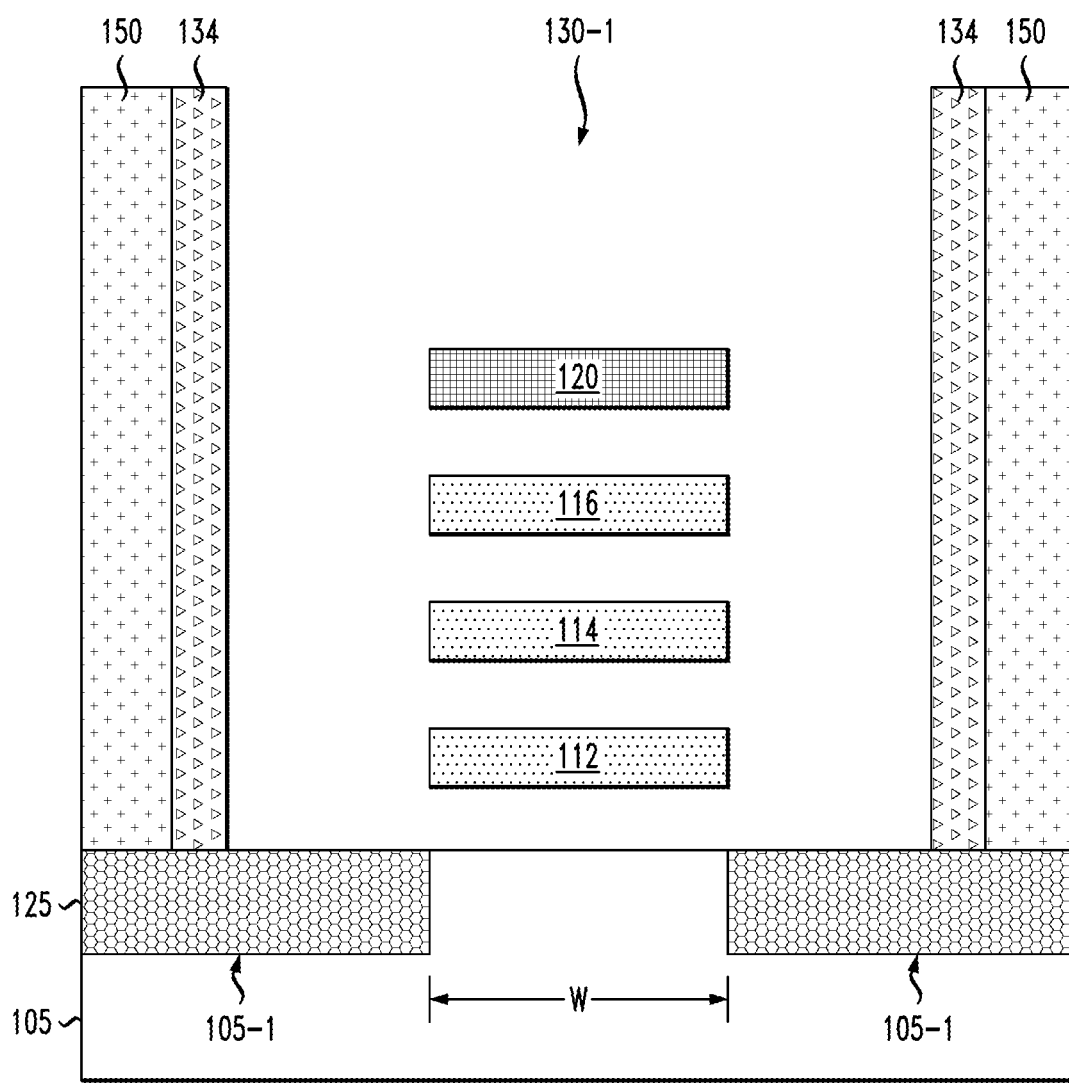
FIG. 5B is a schematic cross-sectional side view of the semiconductor structure of FIG. 5A along line 5B-5B shown in FIG. 5A.
Figure 6A:
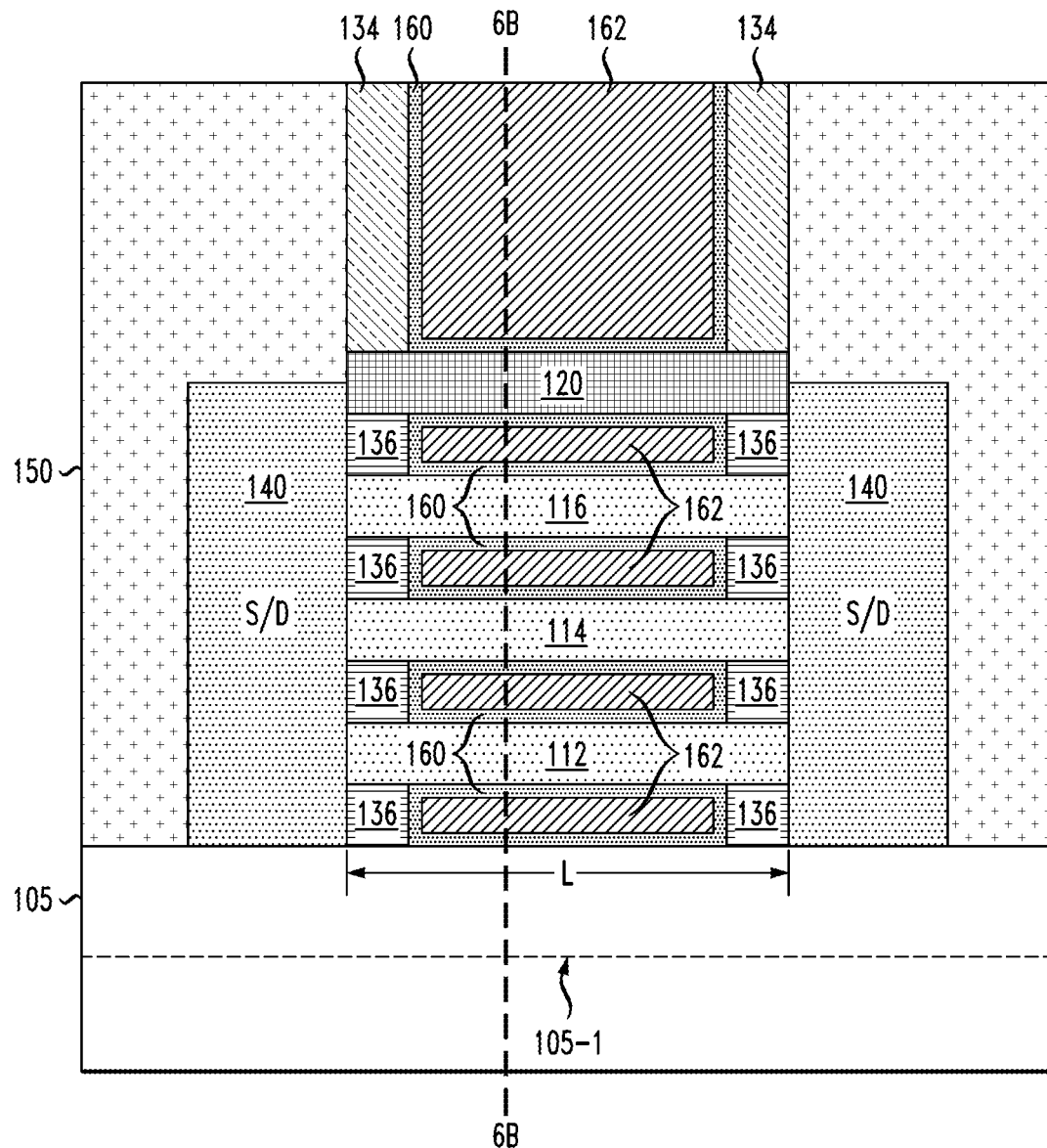
FIG. 6A is a schematic cross-sectional side view of the semiconductor structure shown in FIG. 5A after forming high-k gate dielectric layers on exposed surfaces within the open gate region and filling the open gate region with a work function metal layer.
Figure 6B:
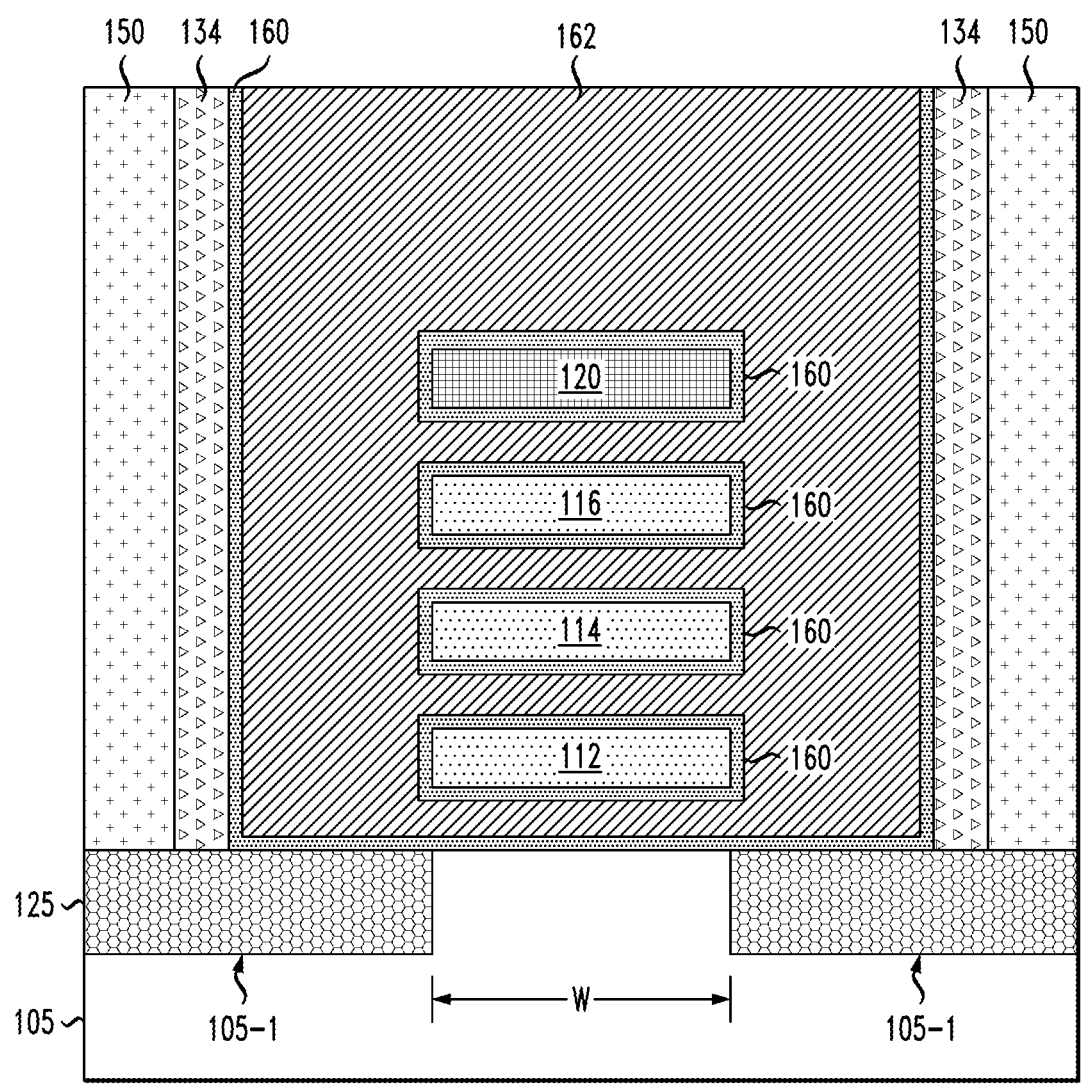
FIG. 6B is a schematic cross-sectional side view of the semiconductor structure of FIG. 6A along line 6B-6B shown in FIG. 6A.

Next, FIGS. 6A and 6B are schematic cross-sectional side views of the semiconductor structure shown in FIGS. 5A and 5B, respectively, after forming gate dielectric layers 160 on exposed surfaces within the open gate region 130-1 and filling the open gate region 130-1 with a layer of work function metal 162. FIG. 6B is a schematic cross-sectional side view (X-Z plane) of the resulting semiconductor structure along line 6B-6B shown in FIG. 6A. In one embodiment, the gate dielectric layers 160 are formed by depositing one or more conformal layers of gate dielectric material over the exposed surfaces of the semiconductor structure shown in FIGS. 5A and 5B, to conformally cover the surfaces of the etch stop layer 120 and the active nanosheet channel layers 112, 114, and 116 (as well as the bottom and sidewall surfaces of the open gate region 130-1. The gate dielectric layers 160 are preferably formed of a high-k dielectric material having a dielectric constant of about 3.9 or greater. For example, the conformal gate dielectric material can include silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal gate dielectric layers 160 are formed with a thickness in a range of about 0.5 nm to about 2.5 nm, which will vary depending on the target application. The conformal layer of gate dielectric material is deposited using known methods such as ALD, for example, which allows for high conformality of the gate dielectric material.

Although not specifically shown, prior to forming the high-k gate dielectric layers 160, an optional thermal oxidation process can be performed to form a thin silicon oxide interfacial layer on the exposed surfaces of the active nanosheet channel layers 112, 114, and 116. As is known in the art, the use of high-k gate dielectric materials can be problematic in that such dielectric materials typically do not interface well with silicon layers. For example, high-k gate dielectric materials do not passivate a silicon surface, which results in a large number of interface traps and charges and other issues which can degrade device performance. As such, high-k dielectric gate materials are often used in conjunction with a thin interfacial silicon oxide layer which provides an interface between the silicon channel layer and the high-k gate dielectric layer.

The work function metal 162 may comprise one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of nanowire FET devices that are to be formed. The work function metal is deposited using known methods such as ALD, CVD, etc. In one embodiment, as shown in FIGS. 6A and 6B, the work function metal 162 completely fills the spaces above and below the active nanosheet channel layers 112, 114, and 116. Indeed, in this embodiment, as noted above, the thickness (e.g., T1, FIG. 1) of the sacrificial nanosheet layers 111, 113, 115, and 117 is selected to be in a range of about 8 nm to about 10 nm. Assuming the high-k gate dielectric layers 160 are formed with a thickness of about 2 nm, a space of about 4 nm to about 6 nm remains above and below the active nanosheet channel layers 112, 114, and 116 after formation of the high-k dielectric layers 160, wherein the remaining space is filled with the work function metal 162. This is sufficient for short-channel length nanosheet FET devices (where L is about 15 nm or less).

While the work function metal 162 is selected to set the threshold voltage of the nanosheet FET device, the work function metal 162 typically has higher resistivity than other metallic materials such as cobalt, tungsten, ruthenium, copper, etc., which are commonly used to form gate electrode layers. In this regard, the process flow continues to remove an upper portion of the work function metal 162 above the stack of active nanosheet channel layers 112, 114 and 116, and replace the work function metal 162 with a low-resistance metallic material such as cobalt, tungsten, ruthenium, etc., wherein the metallic material has a resistivity which is less than a resistivity of the work function metal 162.

Figure 7A:
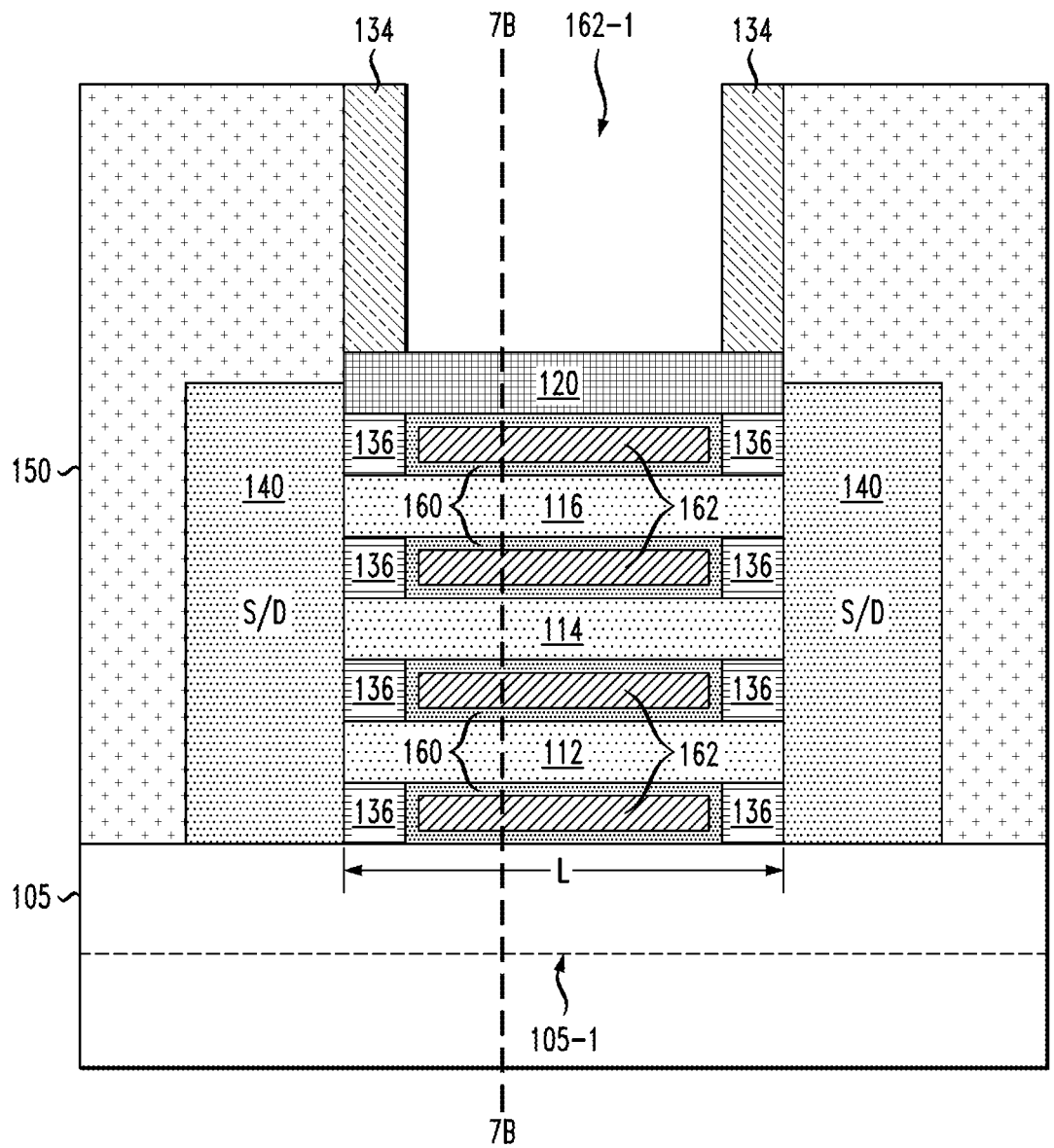
FIG. 7A is a schematic cross-sectional side view of the semiconductor structure of FIG. 6A after removing portions of the work function metal layer and the high-k gate dielectric layer above the etch stop layer of the nanosheet stack structure.
Figure 7B:
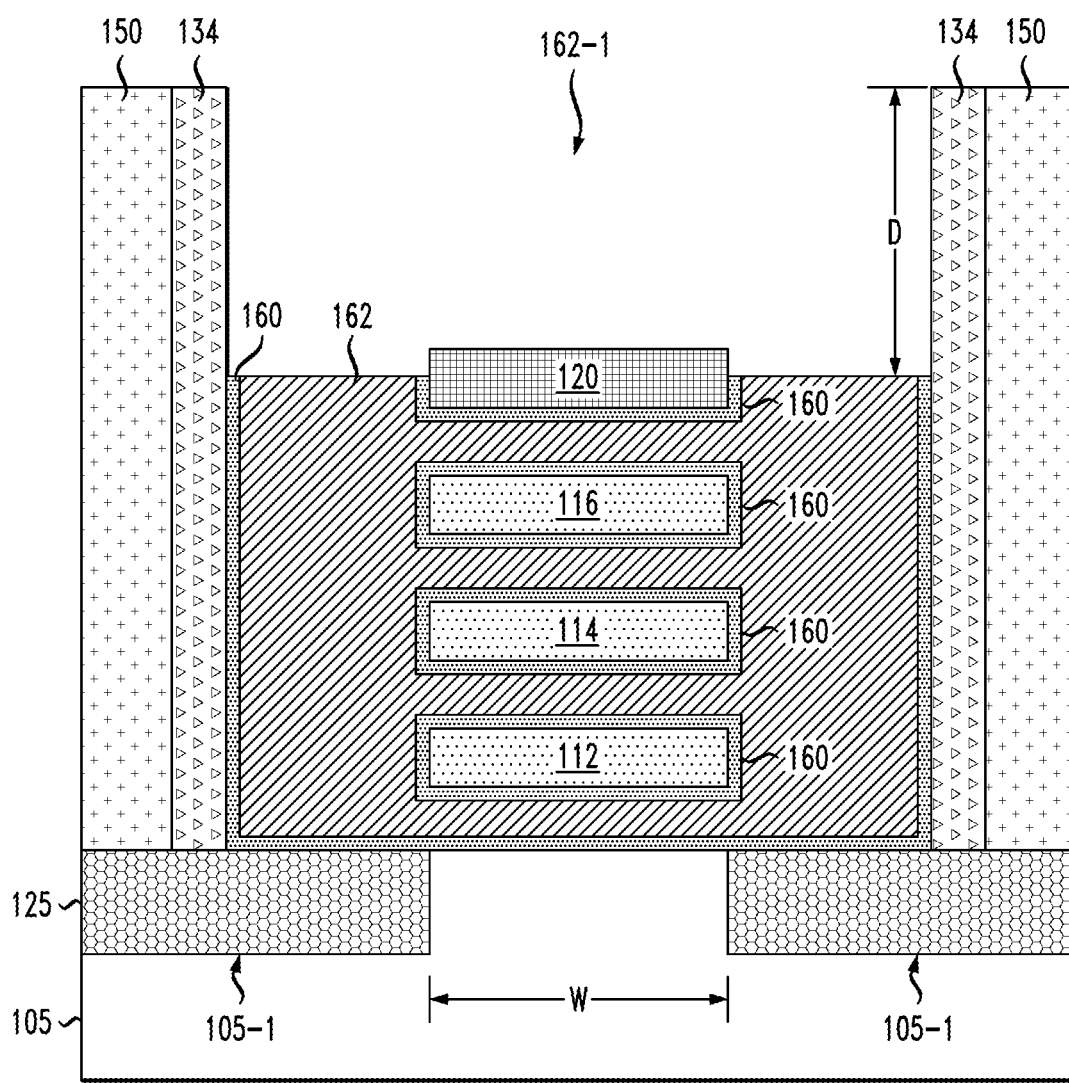
FIG. 7B is a schematic cross-sectional side view of the semiconductor structure of FIG. 7A along line 7B-7B shown in FIG. 7A.

For example, FIGS. 7A and 7B are schematic cross-sectional side views of the semiconductor structure shown in FIGS. 6A and 6B, respectively, after removing portions of the work function metal 162 and the gate dielectric layer 160 above the etch stop layer 120. FIG. 7B is a schematic cross-sectional side view (X-Z plane) of the resulting semiconductor structure along line 7B-7B shown in FIG. 7A. In one embodiment, a dry etch process (e.g., ME) is performed to recess the work function metal 162 down to a depth D below the upper surface of the semiconductor structure to form a recess region 162-1 within the gate region above the etch stop layer 120. With the WFM etch process, the etch stop layer 120 serves as a protective layer which prevents etching of the portion of the work function metal 162 in the space between the etch stop layer 120 and the upper active nanosheet channel layer 116. The etch stop layer 120 serves as a termination point for the WFM etch process to ensure that the WFM etch process is terminated at a depth D level which does not exceed a bottom surface of the etch stop layer 120.

In this regard, the thickness of the etch stop layer 120 provides an etch process margin for recessing the work function metal 162 to the desired target depth D level which is substantially coplanar with the upper surface of the etch stop layer 120 or which otherwise falls within the thickness of the etch stop layer 120 (as schematically shown in FIG. 7B). For example, while a timed WFM etch can be performed to ensure that the work function metal 162 is recessed to the desired depth D level, the etch byproducts of the WFM etch process can be monitored during the WFM etch process to determine when a decrease in the work function metal byproducts occurs, which indicates that that the etch stop layer 120 has been reached, and thus, the WFM etch process is terminated.

Furthermore, in one embodiment, following the WFM recess process, the exposed portion of the gate dielectric layer 160 within the recess region 162-1 can be removed selectively to the materials of the etch stop layer 120 and the work function metal 162. The removal of the exposed portion of the gate dielectric layer 160 increase the volume of the recess region 162-1 within the gate region to fill with low-resistance (or low resistivity) metallic material. While some material of the etch stop layer 120 may be etched during the high-k etch process to remove the exposed portions of the gate dielectric layer 160, such etching of the etch stop layer 120 is not problematic as the thickness of the etch stop layer 120 is 2× or more than the thickness of the gate dielectric layer 160. As such, the high-k etch process will not result in exposure damage or etching of the portion of the work function metal 162 in the space between the etch stop layer 120 and the upper active nanosheet channel layer 116.

The resulting semiconductor structure shown in FIGS. 7A and 7B comprises a stack of active nanosheet channel layers 112, 114, and 116 which have a uniform surrounding environment. In particular, the active nanosheet channel layers 112, 114, and 116 have the same (or substantially the same) same amount of work function metal 162 in the regions above and below (and on the sides) of the active nanosheet channels 112, 114 and 116, which prevents or minimizes Vt variation of the active nanosheet channels 112, 114 and 116 for the given nanosheet FET device, as well as the Vt variation over different nanosheet FET devices within the device regions. Indeed, without the etch stop layer 120, the depth D of the WFM recess would result in variation in the thickness, or in the removal of the portion of the work function metal 162 above the upper active nanosheet channel layer 116, resulting in undesirable Vt variation, or dysfunction of the upper active nanosheet channel layer 116.

Figure 8:
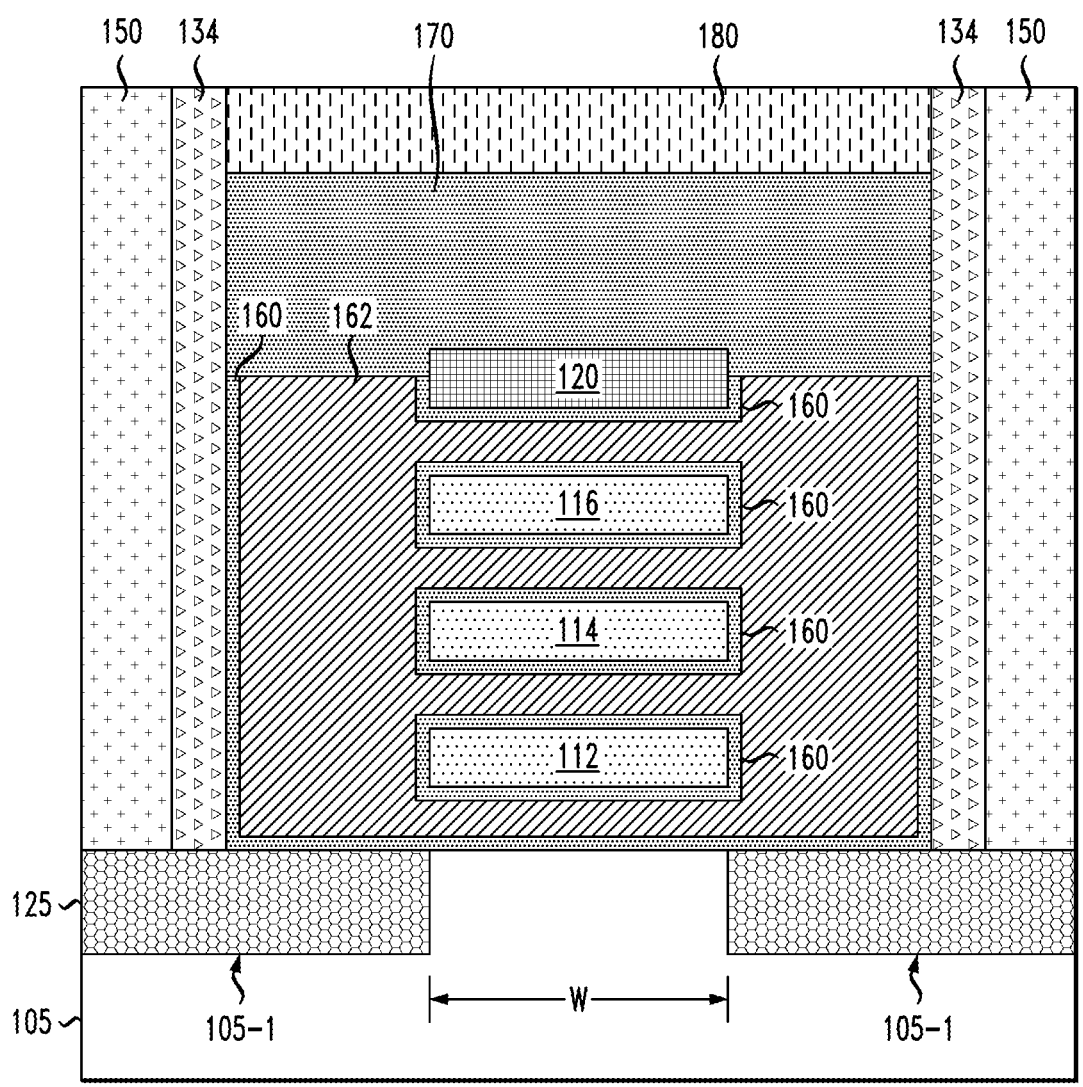

Next, FIG. 8 is a schematic cross-sectional side view of the semiconductor structure shown in FIG. 7B after forming a metallic gate electrode layer 170 and a gate capping layer 180 above the etch stop layer 120 within the recess region 162-1 of the gate region. In one embodiment, the metallic gate electrode layer 170 is formed by depositing a layer of metallic material to fill the recess region 162-1 of the gate region, wherein the metallic material comprises a low-resistance (or low resistivity) metallic material such as tungsten, ruthenium, cobalt, copper, aluminum, gold, etc.

The metallic material of the gate electrode layer 170 has a resistivity which is less than a resistivity of the work function metal 162. In one embodiment, a liner layer (e.g., seed layer and/or diffusion barrier layer) is deposited to line the exposed bottom and sidewall surfaces within the recess region 162-1 of the gate region prior to depositing the low-resistance metallic material.

Following the deposition of the metallic materials which form the liner layer and the gate electrode layer 170, a CMP process is performed to polish the surface of the semiconductor structure down to the ILD layer 150, thereby removing overburden metallic materials of the liner layer and the metallic gate electrode layer 170. An etch process is then performed to recess an upper portion of the metallic gate electrode layer 170 down to a target level below the upper surface of the ILD layer 150. A layer of dielectric material is then deposited over the surface of the semiconductor structure to fill the area above the recessed surface of the metallic gate electrode layer 170 with dielectric material, and the semiconductor structure is planarized down to the surface of the ILD layer 150 to remove the overburden dielectric material, and thereby form the gate capping layer 180. The gate capping layer 180 can be formed of a dielectric material such as SiN or SiBCN, etc.

Following the formation of the semiconductor structure shown in FIG. 8, any known sequence of processing steps can be performed to complete the fabrication of the semiconductor integrated circuit device, the details of which are not needed to understand embodiments of the invention. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

Figure 9A:
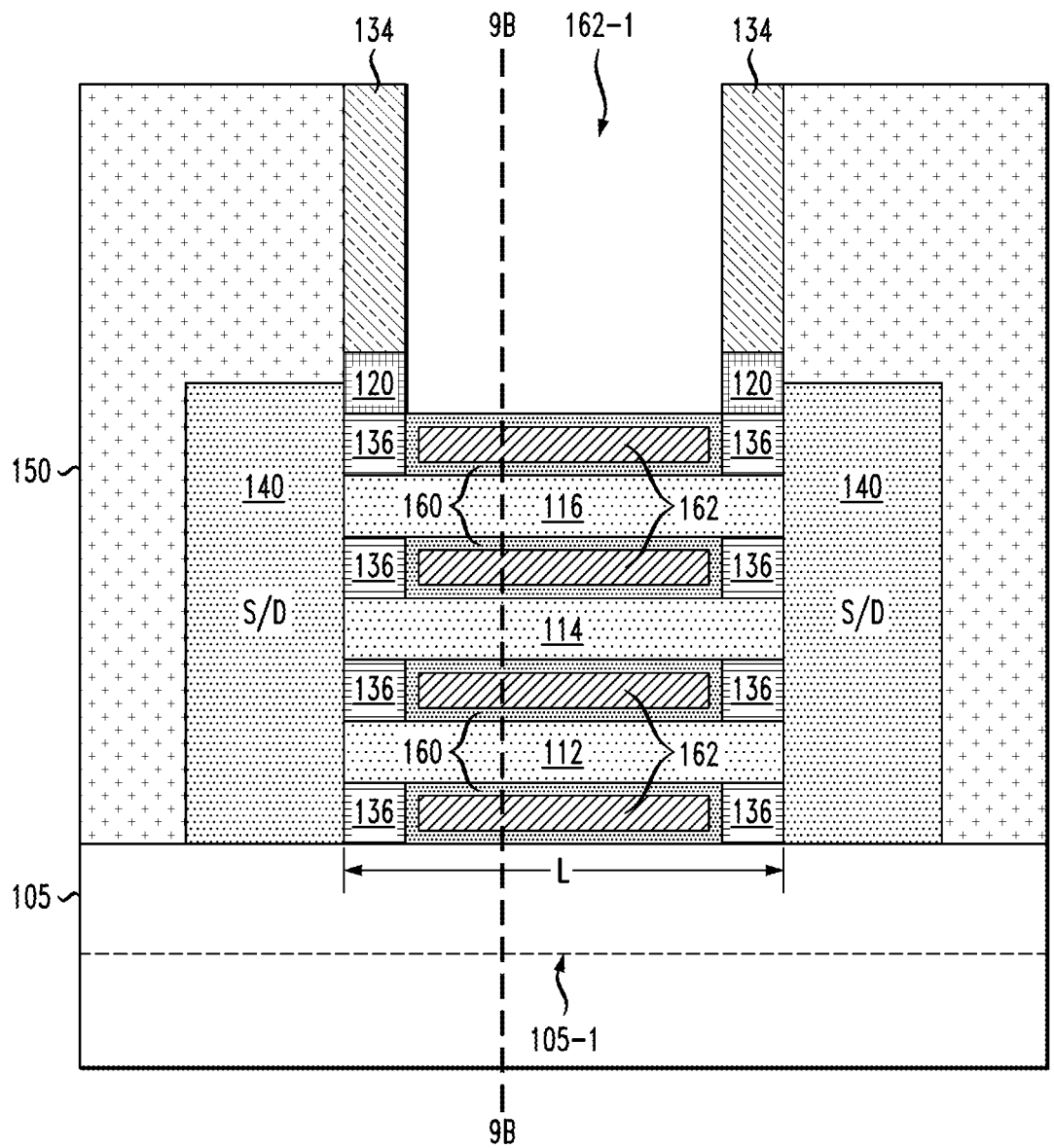
Figure 9B:
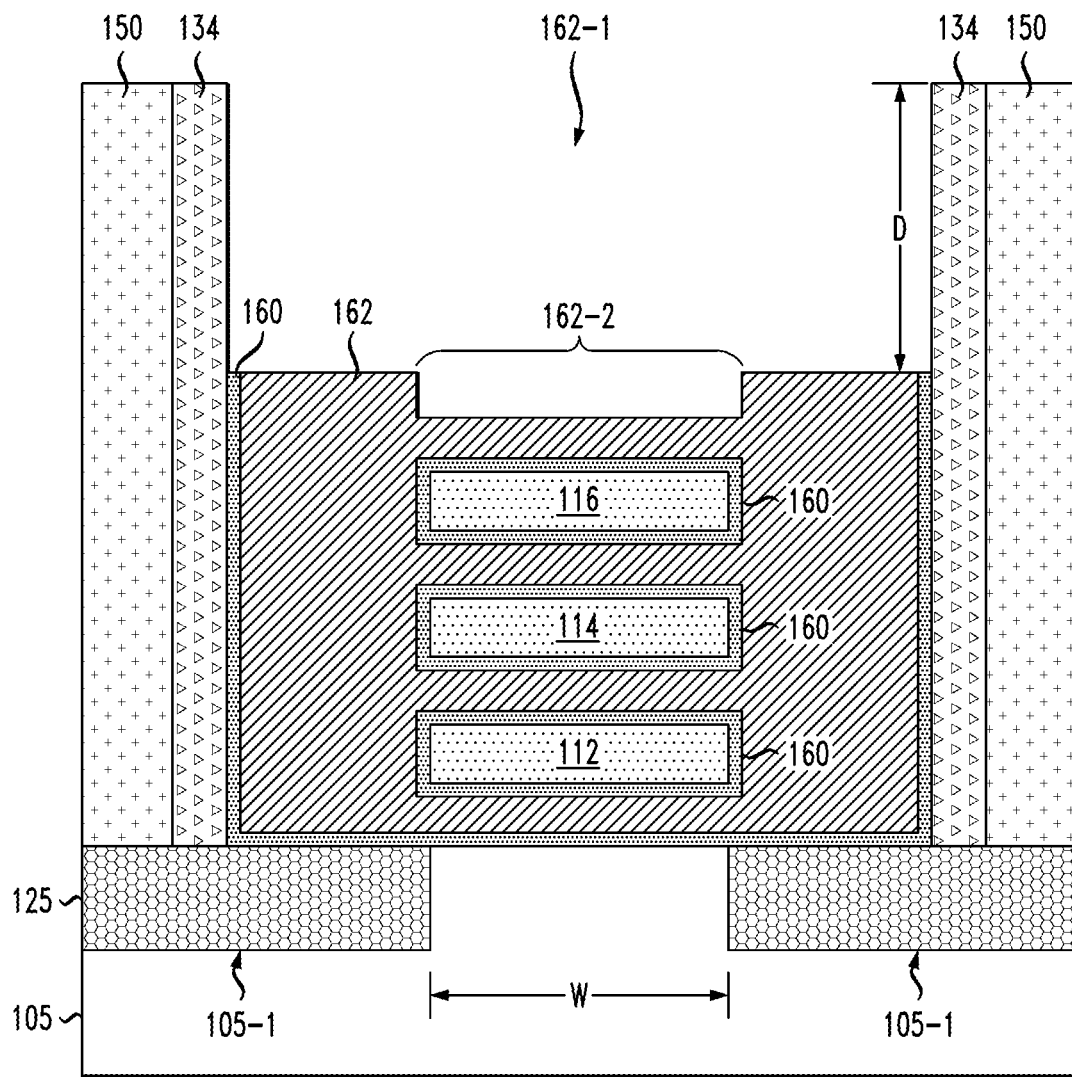
Figure 10:
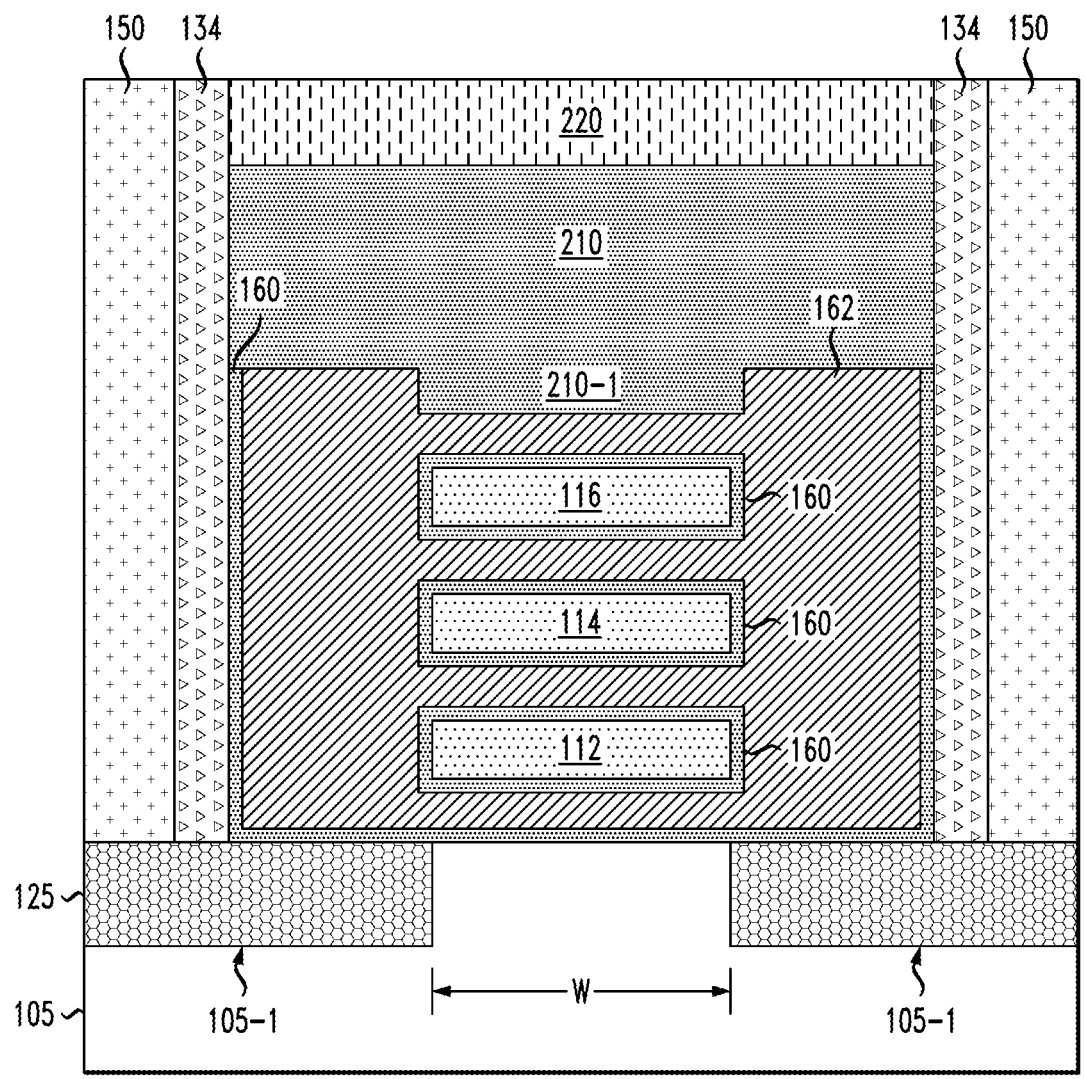

FIGS. 9A, 9B, and 10 schematically illustrate a method for fabricating a nanosheet FET device comprising a low-resistance metallic gate structure, according to another embodiment of the invention. In particular, the process flow of FIGS. 9A, 9B and 10 provides an alternate embodiment starting with the semiconductor structure shown in FIGS. 7A and 7B, wherein prior to forming the low-resistance metallic gate electrode layer, an etch process module is performed to remove the etch stop layer 120 and the associated residual high-k gate dielectric material 160 formed on the etch stop layer 120. With this embodiment, the final metallic gate structure of the nanosheet FET device does not include the residual materials of the etch stop layer 120 and the associated high-k gate dielectric material 160 embedded within the metallic gate electrode structure of the nanosheet FET device.

In particular, FIGS. 9A and 9B are schematic cross-sectional side views of the semiconductor structure shown in FIGS. 7A and 7B, respectively, after removing the etch stop layer 120 and the high-k gate dielectric material 160 formed on the etch stop layer 120. FIG. 9A is a schematic cross-sectional side view (Y-Z plane) of the resulting semiconductor structure, and FIG. 9B is a schematic cross-sectional side view (X-Z plane) of the resulting semiconductor structure along line 9B-9B shown in FIG. 9A. In one embodiment, the etch stop layer 120 is etched using a directional dry etch process (e.g., RIE) with an etch chemistry that is configured to etch the material of the etch stop layer 120 selective to the work function metal layer 162 and the high-k gate dielectric material 160, and other surrounding features such as the gate sidewall spacer 134. Another etch process is then performed to etch away the exposed residual material of the high-k dielectric layer 160 selective to the work function metal layer 162 and surrounding features. The etch processes result in the removal of the etch stop layer 120 and the associated residual high-k dielectric material, forming a recessed region 162-2 in the upper surface of the work function metal layer 162 above the stack of active nanosheet channel layers 112, 114, and 116, as shown in FIG. 9B, while a portion of the etch stop layer 120 remains in the spaces between the gate sidewall spacer 134 and the inner spacers 136, as schematically illustrated in FIG. 9A.

Next, FIG. 10 is a schematic cross-sectional side view of the semiconductor structure shown in FIG. 9B after forming a metallic gate electrode layer 210 and a gate capping 220 within the recess region 162-1 of the gate region, resulting in a semiconductor nanosheet FET device 200 as shown in FIG. 10. The metallic gate electrode layer 210 and the gate capping layer 220 are formed using the same or similar materials and deposition/patterning methods as the metallic gate electrode layer 170 and the gate capping layer 180 discussed above in connection with FIG. 8. However, as compared to the metal gate structure (WFM layer 162 and metallic gate electrode layer 170) of the semiconductor device 100 shown in FIG. 8, the metal gate structure (WFM layer 162 and metallic gate electrode layer 210) of the semiconductor device 200 of FIG. 10 is devoid of embedded residual material of the etch stop layer 120 and the associated high-k gate dielectric layer 160. In particular, as shown in FIG. 10, a portion 210-1 of the metal gate electrode layer 210 is disposed within the recessed region 162-2 (FIG. 9B) above the stack of active nanosheet channel layers 112, 114, and 116. With the exemplary embodiment shown in FIG. 10, there is additional surface area contact between the metallic gate electrode layer 210 and the work function metal layer 162, resulting in a further reduction in the resistance of the metal gate structure (as compared to the metal gate structure of the nanosheet FET device 100 shown in FIG. 8).

Figure 11:
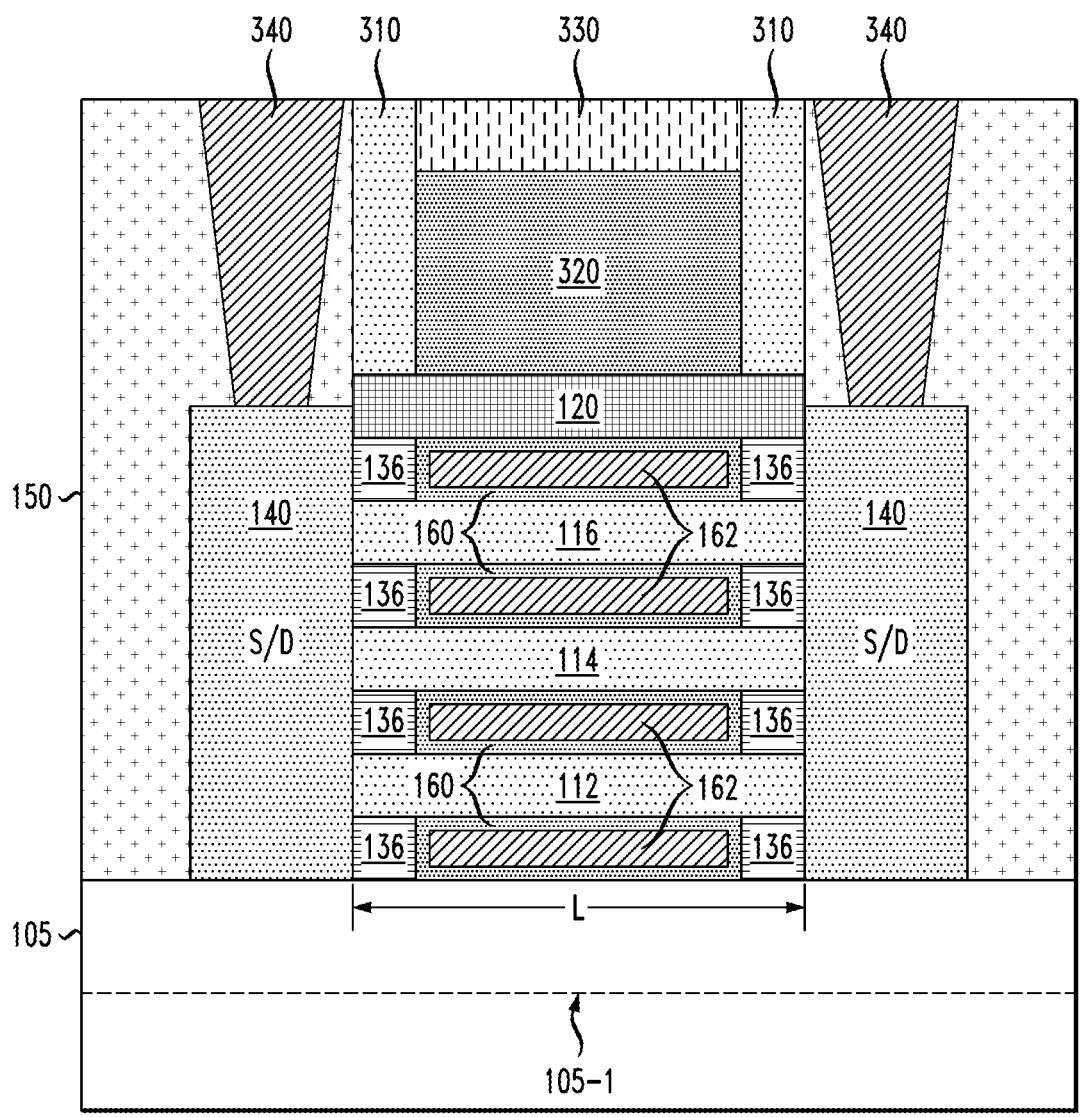
Figure 12:
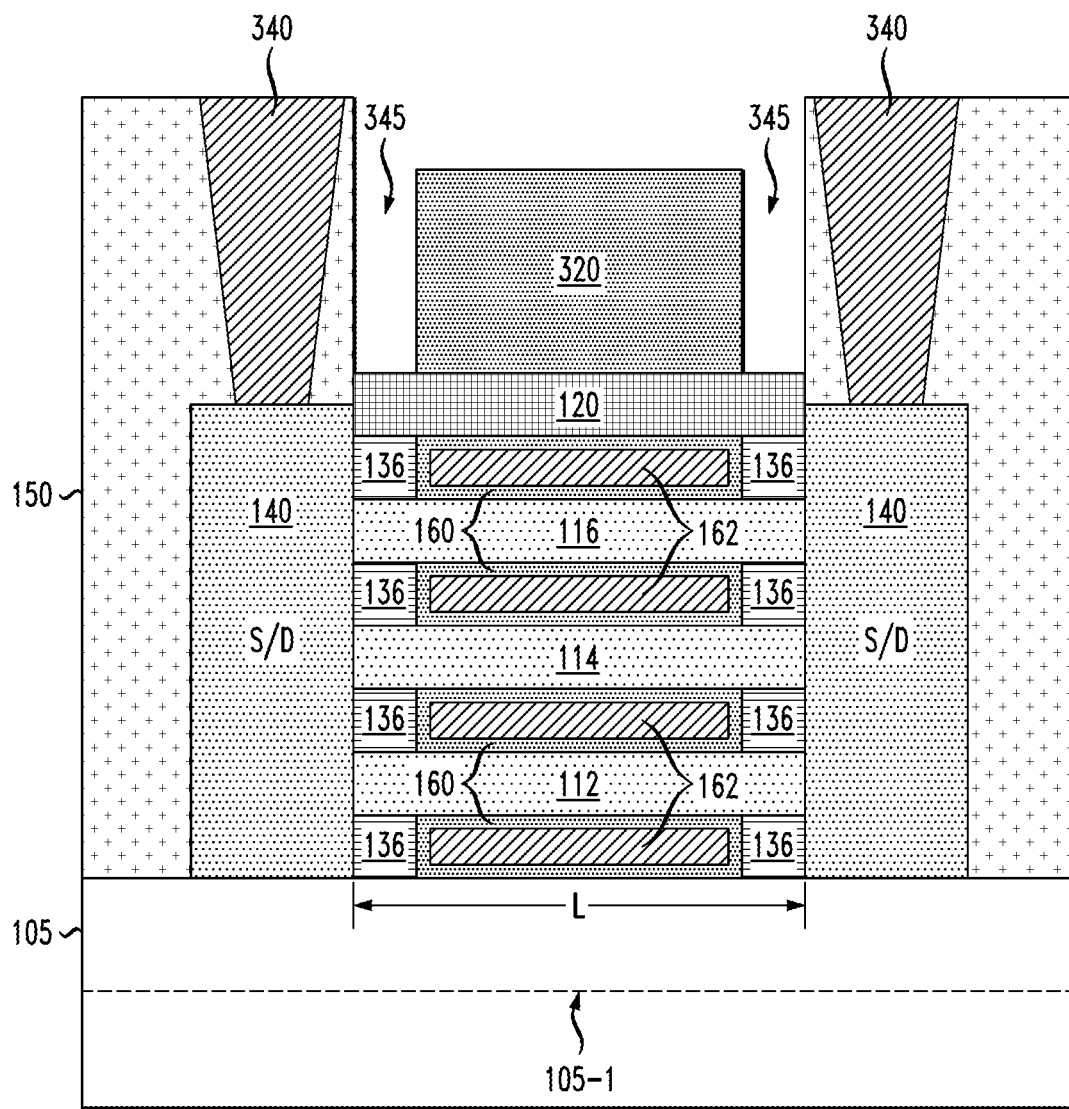
Figure 13:
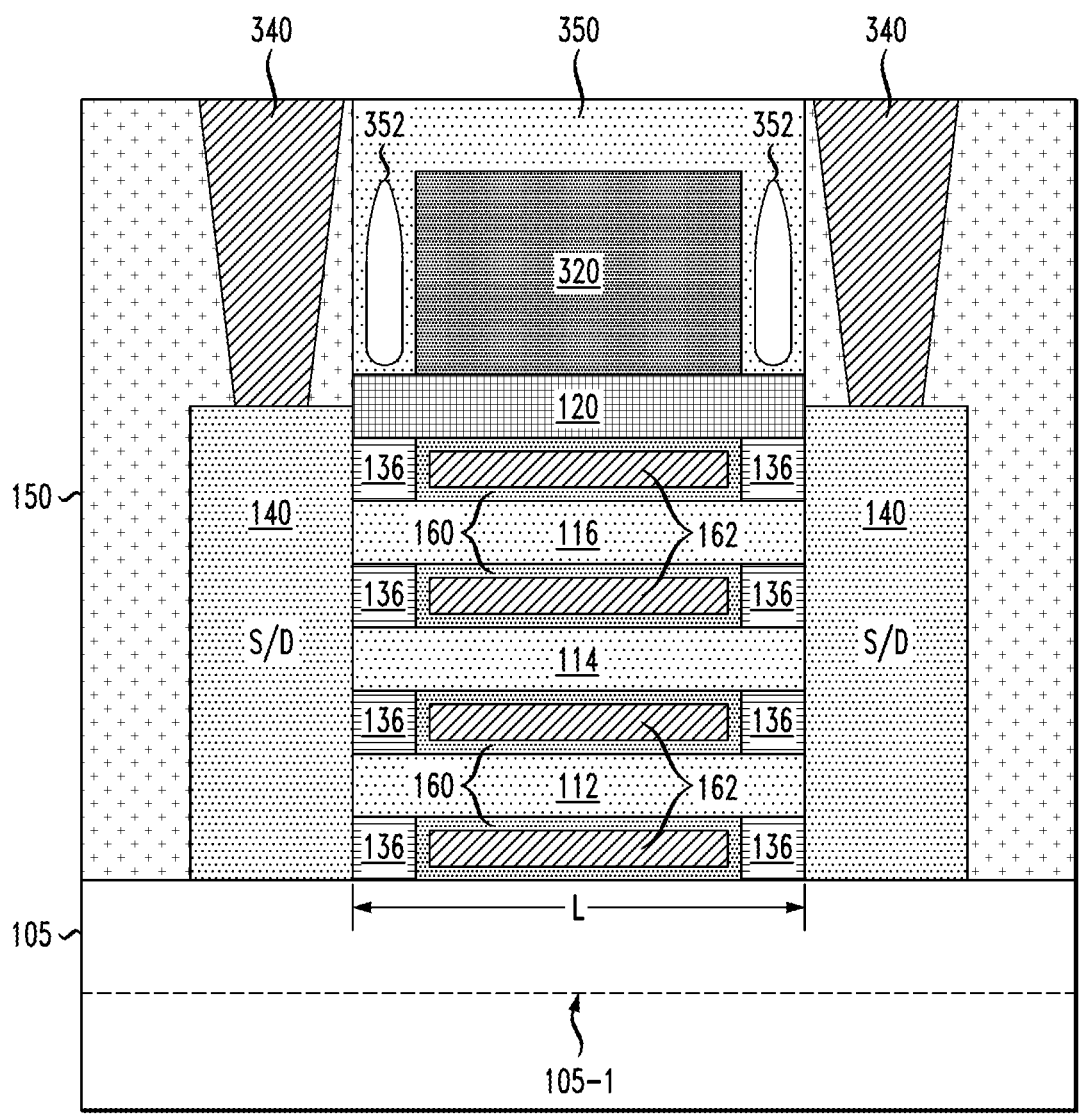

FIGS. 11, 12, and 13 schematically illustrate a method for fabricating a nanosheet FET device comprising a low-resistance metallic gate structure, according to another embodiment of the invention. In particular, the process flow of FIGS. 11, 12, and 13 provides an alternate embodiment starting with the semiconductor structure shown in FIGS. 7A and 7B, to fabricate a nanosheet FET device 300 (FIG. 13) comprising a metal gate structure with a low-resistance metallic gate electrode layer and with air spacers disposed between the low-resistance metallic gate electrode layer and adjacent source/drain contacts. To begin, FIG. 11 is a schematic cross-sectional side view of the semiconductor structure shown in FIG. 7A after replacing the gate sidewall spacer 134 with a sacrificial spacer 310, and after forming a low-resistance metallic gate electrode layer 320, a gate capping layer 330, and vertical source/drain contacts 340 in the ILD layer 150, resulting in the intermediate semiconductor structure shown in FIG. 11. The intermediate semiconductor structure of FIG. 11 can be fabricated as follows.

After recessing the work function metal layer 162 and the exposed portions of the high-k dielectric layer 160 within the recess region 162-1 of the gate region (FIGS. 7A and 7B), an etch process is performed to remove the gate sidewall spacer 134 selective to the ILD layer 150 and surrounding features. The sacrificial sidewall spacer 310 is then formed by depositing a conformal layer of sacrificial material, followed by a directional RIE process to remove lateral portions of the conformal layer of sacrificial material (e.g., on top of the ILD layer 150, the etch stop layer 120, the WFM layer 162, etc.), while leaving the vertical portions of the conformal layer of sacrificial material on the sidewalls of the recess region 162-1 to form the sacrificial sidewall spacer 310. The sacrificial sidewall spacer 310 is formed with a material that can be etched selective to the materials of the ILD layer 150 and the etch stop layer 120. For example, the sacrificial sidewall spacer 310 can be formed of amorphous silicon or amorphous carbon, or other material which is suitable for the intended purpose.

After forming the sacrificial sidewall spacer 310, the low-resistance gate electrode layer 320 and the gate capping layer 330 are formed, for example, using materials and methods as discussed above with reference to FIG. 8. For example, the gate electrode layer 320 can be formed by depositing and patterning a layer of metallic material to fill the recess region 162-1 of the gate region, wherein the metallic material comprises a low-resistance metallic material such as tungsten, ruthenium, cobalt, copper, aluminum, gold, etc. The gate capping layer 330 can be formed by depositing and patterning a layer of dielectric materials such as SiN.

The gate capping layer 330 is then utilized, in part, as an etch mask in a self-aligned contact formation process to form the source/drain contacts 340 (e.g., vertical MOL contacts) in the ILD layer 150 in contact with the source/drain layers 140. With this process, self-aligned contact openings are formed in the ILD layer 150 adjacent to the sidewalls of the gate structure to expose the underlying source/drain layers 140. The contact openings are then lined with a suitable liner layer (e.g., seed layer and/or diffusion barrier layer) such as a titanium (Ti) and/or titanium nitride (TiN) liner, to line the bottom and sidewall surfaces of the contact openings, following by a metallic fill process to fill the contact openings with a metallic material (e.g., cobalt, tungsten, ruthenium, etc.) to form the MOL source/drain contacts 340. A CMP process is then performed to planarize the surface of the semiconductor structure down to the gate capping layer 330 to remove the overburden metallic material that was deposited to form the MOL source/drain contacts 340, resulting in the semiconductor structure shown in FIG. 11.

Next, FIG. 12 is a schematic cross-sectional side view of the semiconductor structure shown in FIG. 11 after removing the sacrificial sidewall spacer 310 and the gate capping layer 330. In one embodiment, the sacrificial sidewall spacer 310 is removed using a dry or wet etch process with an etch chemistry that is configured to etch away the material of the sacrificial sidewall spacer 310 selective to the ILD layer 150, the gate capping layer 330, and the underlying etch stop layer 120. In addition, the gate capping layer 330 can be removed using an etch process which is selective to the material (e.g., SiN) of the gate capping layer 330 to prevent etching of the ILD layer 150 and the exposed portions of the etch stop layer 120, thereby resulting in the semiconductor structure shown in FIG. 12 in which narrow open spaces 345 are disposed between the sidewalls of the gate electrode layer 320 and the sidewalls of the MOL contacts 340. With this process, the gate electrode layer 320 and exposed portion of the etch stop layer 120 (at the bottom of the narrow open spaces 345) protect the underlying high-k dielectric layers 160 and work function metal layer 162 from etch damage or contamination by the etch environments used to selectively etch away the sacrificial sidewall spacer 310 and gate capping layer 330.

Next, FIG. 13 is a schematic cross-sectional side view of the semiconductor structure shown in FIG. 12 after forming a dielectric capping layer 350 to encapsulate the low-resistance metallic gate electrode layer 320 and form air gaps 352 in the narrow spaces 345 between the sidewalls of the metallic gate electrode layer 320 and the MOL source/drain contacts 340. The air gaps 352 can be formed by depositing a layer of dielectric material over the semiconductor device shown in FIG. 12 using a non-conformal deposition process (e.g., chemical vapor deposition), which results in the formation of a "pinch-off" region in the layer of dielectric material above the narrow spaces 352 during the deposition process. The pinch-off regions prevent further deposition of the dielectric material with the narrow opens spaces 345, thereby forming the air gaps 352 (or air spacers 352).

In one embodiment of the invention, the dielectric capping layer 350 is formed by PECVD deposition of SiN or SiCN. With this deposition process, the conformality of the dielectric material deposition is low so that while the dielectric material fills the wider space above the metallic gate electrode layer 320, "pinch-off" regions are formed in the dielectric capping layer 350 above the narrow open spaces 345 between the metallic gate electrode layer 320 and the MOL source/drain contacts 340. Following deposition of the dielectric material used to form the dielectric capping layer 350, a CMP process may be performed to planarize the surface of the semiconductor structure down to the upper surface of the ILD layer 150 to remove the overburden dielectric material that was deposited to form the capping layer 350. The dielectric constant of air is about unity, which is much less than the dielectric constant of the dielectric material of the capping layer 350. As such, the resulting "air spacers" formed by the air gaps 352 provide enhanced electrical performance by reducing parasitic capacitance between the closely spaced metallic gate electrode layer 320 and the MOL source/drain contacts 340. With the exemplary embodiment shown in FIG. 13, the low-resistance metallic material of the gate electrode layer 320 above the nanosheet stack serves to reduce the gate resistance, while the air spacers 352 serve to reduce the parasitic capacitance between the source/drain contacts 340 and the metal gate structure of the nanosheet FET device 300 shown in FIG. 13.

It is to be understood that the methods discussed herein for fabricating non-planar FET devices with low-resistance metal gate structures can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method for fabricating a semiconductor device, comprising:
    forming a nanosheet stack structure on a semiconductor substrate, wherein the nanosheet stack structure comprises a stack of alternating semiconductor layers and an etch stop layer formed on the stack of alternating semiconductor layers, wherein the stack of alternating semiconductor layers comprises sacrificial nanosheet layers and active nanosheet channel layers, wherein each active nanosheet channel layer is disposed between sacrificial nanosheet layers in the nanosheet stack structure, and wherein the etch stop layer is formed on an uppermost sacrificial nanosheet layer of the nanosheet stack structure such that the uppermost sacrificial nanosheet layer is disposed between the etch stop layer and an uppermost active nanosheet channel layer;
    forming a dummy gate over the nanosheet stack structure to define a gate region;
    forming a gate sidewall spacer surrounding the dummy gate;
    removing the dummy gate to form an open gate region which exposes a portion of the nanosheet stack structure surrounded by the gate sidewall spacer;
    removing the sacrificial nanosheet layers exposed in the open gate region to release the active nanosheet channel layers and form spaces above and below the active nanosheet channel layers including an uppermost space between the uppermost active nanosheet channel layer and the etch stop layer;
    conformally depositing a gate dielectric material within the open gate region to form a conformal layer of gate dielectric material on exposed surfaces of the etch stop layer and the active nanosheet channel layers within the open gate region;
    filling the open gate region with a layer of work function metal, wherein the layer of work function metal encapsulates the active nanosheet channel layers and fills the spaces above and below the active nanosheet channel layers;
    performing an etch process to recess an upper surface of the layer of work function metal in the gate region down to a level between an upper surface and a lower surface of the etch stop layer, wherein the etch stop layer prevents etching of the work function metal in the uppermost space between the uppermost active nanosheet channel layer and the etch stop layer; and
    filling the gate region above the recessed upper surface of the layer of work function metal with a layer of metallic material to form a gate electrode which is disposed above the upper surface of the etch stop layer and in contact with the recessed upper surface of the layer of work function metal, wherein the metallic material of the gate electrode has a resistivity which is less than a resistivity of the work function metal.

2. The method of claim 1, wherein the etch stop layer comprises a dielectric material which has etch selectivity with respect to the gate dielectric material and the gate sidewall spacer.

3. The method of claim 1, wherein the etch stop layer comprises a silicon-carbon-oxide material.

4. The method of claim 1, wherein the metallic material of the gate electrode comprises one of cobalt, tungsten, and ruthenium.

5. The method of claim 1, further comprising removing portions of the conformal layer of gate dielectric material which are exposed by the recessed layer of work function metal within the gate region, before filling the gate region with the metallic material to form the gate electrode.

6. The method of claim 5, wherein removing the portions of the conformal layer of gate dielectric material which are exposed by the recessed layer of work function metal within the gate region comprises etching the exposed portions of the conformal layer of gate dielectric material within the gate region selective to the gate sidewall spacer, the etch stop layer, and the recessed layer of work function metal.

7. The method of claim 1, further comprising:
recessing the gate electrode within the gate region;
forming a gate capping layer above a recessed surface of the gate electrode; and
forming self-aligned, vertical source/drain contacts adjacent to the gate sidewall spacer.

8. The method of claim 1, further comprising forming air spacers adjacent to vertical sidewalls of the gate electrode.

9. The method of claim 8, wherein forming the air spacers comprises:
selectively removing a portion of the gate sidewall spacer which is disposed above the etch stop layer and which surrounds the gate electrode to form narrow open spaces adjacent to vertical sidewalls of the gate electrode; and
depositing a non-conformal layer of dielectric material to form pinch-off regions in the deposited dielectric material above the narrow open spaces, wherein the pinch-off regions prevent further deposition of the dielectric material with the narrow open spaces to form air gaps adjacent to the vertical sidewalls of the gate electrode.

10. The method of claim 1, wherein a thickness of the sacrificial nanosheet layers is in a range of about 8 nm to about 10 nm, wherein a thickness of the active nanosheet channel layers is in a range of about 6 nm to about 8 nm, and wherein a thickness of the etch stop layer is in a range of about 5 nm to about 7 nm.

11. The method of claim 1, wherein the gate dielectric material comprises a high-k dielectric material, wherein k is greater than 3.9.

12. A method for fabricating a semiconductor device, comprising:
forming a nanosheet stack structure on a semiconductor substrate, wherein the nanosheet stack structure comprises a stack of alternating semiconductor layers and an etch stop layer formed on the stack of alternating semiconductor layers, wherein the stack of alternating semiconductor layers comprises sacrificial nanosheet layers and active nanosheet channel layers, wherein each active nanosheet channel layer is disposed between sacrificial nanosheet layers in the nanosheet stack structure, and wherein the etch stop layer is formed on an uppermost sacrificial nanosheet layer of the nanosheet stack structure such that the uppermost sacrificial nanosheet layer is disposed between the etch stop layer and an uppermost active nanosheet channel layer;
forming a dummy gate over the nanosheet stack structure to define a gate region;
forming a gate sidewall spacer surrounding the dummy gate;
etching exposed portions of the nanosheet stack structure, which are not covered by the dummy gate and gate sidewall spacer, down to an upper surface of the semiconductor substrate;
laterally recessing exposed sidewall surfaces of the sacrificial nanosheet layers to form recesses in sidewalls of the nanosheet stack structure, wherein the lateral recessing is performed by etching the sacrificial nanosheet layers selective to the active nanosheet channel layers and the etch stop layer;
filling the recesses with dielectric material to form embedded sidewall spacers;
forming a source/drain layers in contact with end portions of the active nanosheet channel layers exposed by the embedded sidewall spacers;
forming an interlaying dielectric layer to cover the source/drain layers;
removing the dummy gate to form an open gate region which exposes a portion of the nanosheet stack structure surrounded by the gate sidewall spacer;
removing the sacrificial nanosheet layers exposed in the open gate region to release the active nanosheet channel layers and form spaces above and below the active nanosheet channel layers including an uppermost space between the uppermost active nanosheet channel layer and the etch stop layer;
conformally depositing a gate dielectric material within the open gate region to form a conformal layer of gate dielectric material on exposed surfaces of the etch stop layer and the active nanosheet channel layers within the open gate region;
filling the open gate region with a layer of work function metal, wherein the layer of work function metal encapsulates the active nanosheet channel layers and fills the spaces above and below the active nanosheet channel layers;
performing an etch process to recess an upper surface of the layer of work function metal in the gate region down to a level between an upper surface and a lower surface of the etch stop layer, wherein the etch stop layer prevents etching of the work function metal in the uppermost space between the uppermost active nanosheet channel layer and the etch stop layer; and
filling the gate region above the recessed upper surface of the layer of work function metal with a layer of metallic material to form a gate electrode which is disposed above the upper surface of the etch stop layer and in contact with the recessed upper surface of the layer of work function metal, wherein the metallic material of the gate electrode has a resistivity which is less than a resistivity of the work function metal.

13. The method of claim 12, wherein the etch stop layer comprises a dielectric material which has etch selectivity with respect to the gate dielectric material and the gate sidewall spacer.

14. The method of claim 12, wherein the etch stop layer comprises a silicon-carbon-oxide material.

15. The method of claim 12, wherein the metallic material of the gate electrode comprises one of cobalt, tungsten, and ruthenium.

16. The method of claim 12, further comprising removing portions of the conformal layer of gate dielectric material which are exposed by the recessed layer of work function metal within the gate region, before filling the gate region with the metallic material to form the gate electrode.

17. The method of claim 12, wherein a thickness of the sacrificial nanosheet layers is in a range of about 8 nm to about 10 nm, wherein a thickness of the active nanosheet channel layers is in a range of about 6 nm to about 8 nm, and wherein a thickness of the etch stop layer is in a range of about 5 nm to about 7 nm.

18. The method of claim 12, wherein the gate dielectric material comprises a high-k dielectric material, wherein k is greater than 3.9.

19. A method for fabricating a semiconductor device, comprising:

forming a nanosheet stack structure on a semiconductor substrate, wherein the nanosheet stack structure comprises a stack of alternating semiconductor layers and an etch stop layer formed on the stack of alternating semiconductor layers, wherein the stack of alternating semiconductor layers comprises sacrificial nanosheet layers and active nanosheet channel layers, wherein each active nanosheet channel layer is disposed between sacrificial nanosheet layers in the nanosheet stack structure, and wherein the etch stop layer is formed on an uppermost sacrificial nanosheet layer of the nanosheet stack structure such that the uppermost sacrificial nanosheet layer is disposed between the etch stop layer and an uppermost active nanosheet channel layer;

forming a dummy gate over the nanosheet stack structure to define a gate region;

forming a gate sidewall spacer surrounding the dummy gate;

removing the dummy gate to form an open gate region which exposes a portion of the nanosheet stack structure surrounded by the gate sidewall spacer;

removing the sacrificial nanosheet layers exposed in the open gate region to release the active nanosheet channel layers and form spaces above and below the active nanosheet channel layers including an uppermost space between the uppermost active nanosheet channel layer and the etch stop layer;

conformally depositing a gate dielectric material within the open gate region to form a conformal layer of gate dielectric material on exposed surfaces of the etch stop layer and the active nanosheet channel layers within the open gate region;

filling the open gate region with a layer of work function metal, wherein the layer of work function metal encapsulates the active nanosheet channel layers and fills the spaces above and below the active nanosheet channel layers;

performing an etch process to recess an upper surface of the layer of work function metal in the gate region down to a level between an upper surface and a lower surface of the etch stop layer, wherein the etch stop layer prevents etching of the work function metal in the uppermost space between the uppermost active nanosheet channel layer and the etch stop layer such that a thickness of the work function metal in the uppermost space above the uppermost active nanosheet channel layer active nanosheet channel layers remains substantially the same;

removing a portion of the etch stop layer within the gate region by etching an exposed portion of the etch stop layer within the gate region selective to the gate sidewall spacer, the gate dielectric material, and the recessed layer of work function metal; and filling the gate region above the recessed upper surface of the layer of work function metal with a layer of metallic material to form a gate electrode which is disposed above and in contact with the recessed upper surface of the layer of work function metal, wherein the metallic material of the gate electrode has a resistivity which is less than a resistivity of the work function metal.

20. The method of claim 19, wherein the etch stop layer comprises a dielectric material which has etch selectivity with respect to the gate dielectric material and the gate sidewall spacer.

* * * * *